United States Patent
Nakagawa

(10) Patent No.: US 9,490,773 B2
(45) Date of Patent: Nov. 8, 2016

(54) VIBRATING ELEMENT, ELECTRONIC DEVICE, ELECTRONIC APPARATUS, AND MOVING OBJECT

(71) Applicant: Seiko Epson Corporation, Tokyo (JP)

(72) Inventor: Keiji Nakagawa, Minowa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/921,166

(22) Filed: Oct. 23, 2015

(65) Prior Publication Data

US 2016/0126924 A1    May 5, 2016

(30) Foreign Application Priority Data

Oct. 29, 2014  (JP) ................. 2014-220041

(51) Int. Cl.
*H03H 9/21*    (2006.01)
*H03B 5/30*    (2006.01)

(52) U.S. Cl.
CPC . *H03H 9/21* (2013.01); *H03B 5/30* (2013.01)

(58) Field of Classification Search
CPC ............................... H03H 9/21; H03H 9/215
USPC .......................................... 331/156; 310/370
See application file for complete search history.

(56) References Cited

U.S. PATENT DOCUMENTS

| | | |
|---|---|---|
| 2004/0099043 A1 | 5/2004 | Omawari et al. |
| 2008/0210006 A1 | 9/2008 | Endo et al. |
| 2011/0227451 A1* | 9/2011 | Yamazaki .......... H03H 9/02086 310/318 |
| 2012/0326571 A1 | 12/2012 | Shimura et al. |

FOREIGN PATENT DOCUMENTS

| | | |
|---|---|---|
| JP | 10-288527 A | 10/1998 |
| JP | 2002-243451 A | 8/2002 |
| JP | 2006-258504 A | 9/2006 |
| JP | 2008-157748 A | 7/2008 |
| JP | 2013-009221 A | 1/2013 |

* cited by examiner

*Primary Examiner* — Joseph Chang
(74) *Attorney, Agent, or Firm* — Harness, Dickey & Pierce, P.L.C.

(57) ABSTRACT

A tuning fork-type vibrator element as a vibrating element includes a drive vibrating arm that performs a flexural vibration, and a drive electrode (a first drive electrode and a second drive electrode) provided on the drive vibrating arm. When a direction in which the drive vibrating arm extends is a Y-axis, a direction in which the drive vibrating arm performs a primary vibration is an X-axis, and a direction orthogonal to the Y-axis and the X-axis is a Z-axis, the drive vibrating arm performs the flexural vibration with a displacement ratio of greater than 0% and 20% or less where the displacement ratio is obtained by dividing a displacement amount in the Z-axis direction by a displacement amount in the X-axis direction.

12 Claims, 13 Drawing Sheets

| SHIFT AMOUNT (%) | ANGLE (°) | DISPLACEMENT RATIO (%) | SHIFT AMOUNT (%) | ANGLE (°) | DISPLACEMENT RATIO (%) |
|---|---|---|---|---|---|
| -1.5 | -0.86 | -32 | 0.1 | 0.06 | 3 |
| -1.4 | -0.80 | -31 | 0.2 | 0.11 | 6 |
| -1.3 | -0.74 | -29 | 0.3 | 0.17 | 8 |
| -1.2 | -0.69 | -28 | 0.4 | 0.23 | 11 |
| -1.1 | -0.63 | -26 | 0.5 | 0.29 | 14 |
| -1.0 | -0.57 | -24 | 0.6 | 0.34 | 16 |
| -0.9 | -0.52 | -22 | 0.7 | 0.40 | 18 |
| -0.8 | -0.46 | -20 | 0.8 | 0.46 | 20 |
| -0.7 | -0.40 | -18 | 0.9 | 0.52 | 22 |
| -0.6 | -0.34 | -16 | 1.0 | 0.57 | 24 |
| -0.5 | -0.29 | -14 | 1.1 | 0.63 | 26 |
| -0.4 | -0.23 | -11 | 1.2 | 0.69 | 28 |
| -0.3 | -0.17 | -8 | 1.3 | 0.74 | 29 |
| -0.2 | -0.11 | -6 | 1.4 | 0.80 | 31 |
| -0.1 | -0.06 | -3 | 1.5 | 0.86 | 32 |
| 0.0 | 0.00 | 0 | | | |

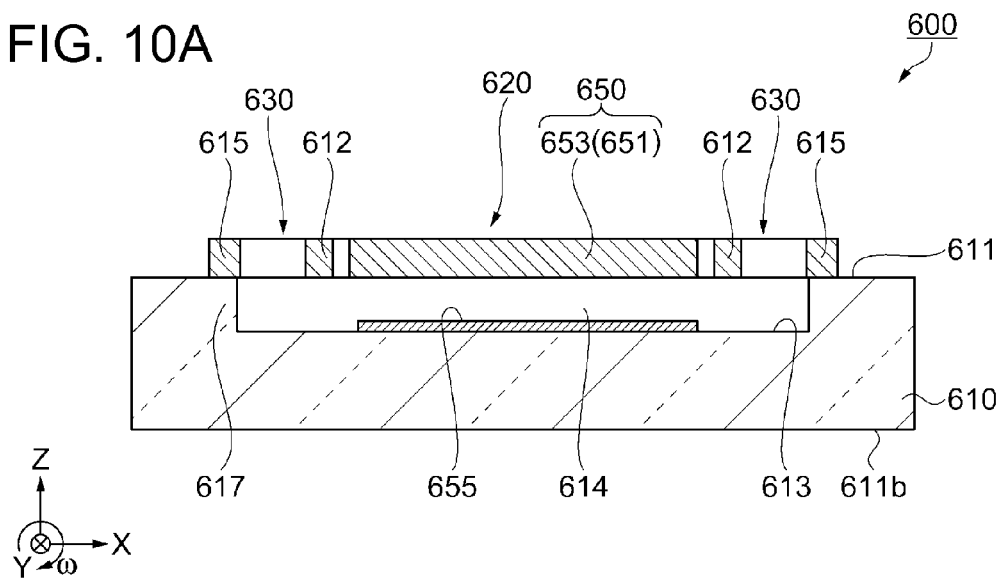
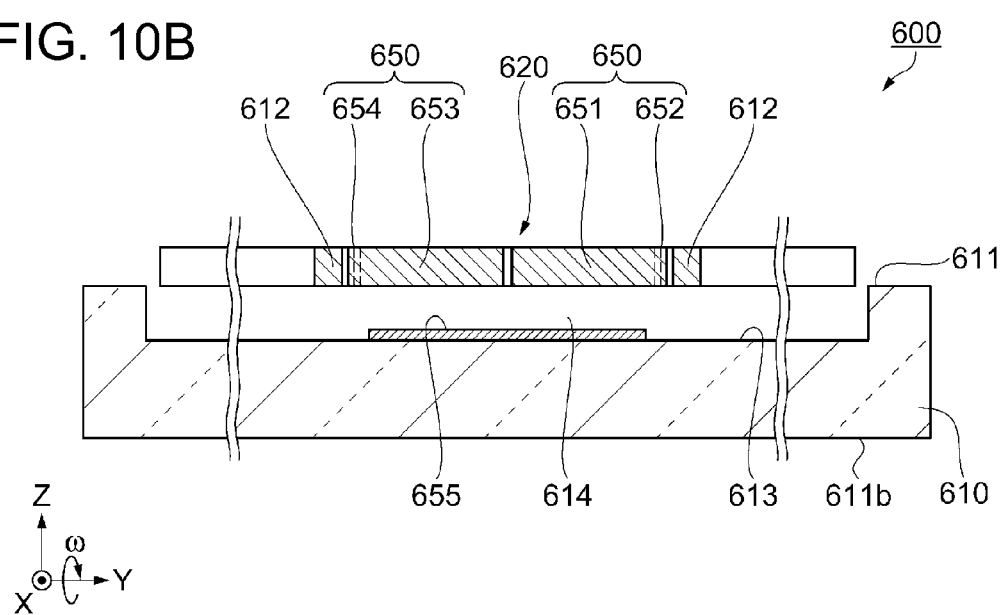

VIBRATING ELEMENT, ELECTRONIC DEVICE, ELECTRONIC APPARATUS, AND MOVING OBJECT

BACKGROUND

1. Technical Field

The present invention relates to a vibrating element, an electronic device, an electronic apparatus, and a moving object.

2. Related Art

In the related art, a vibrating element in which, for example, a vibrating arm is caused to perform a flexural vibration utilizing a piezoelectric phenomenon of a piezoelectric body such as quartz crystal is known. The vibrating element using quartz crystal has excellent frequency-temperature characteristics, and therefore is widely used as a reference frequency source or a signal transmission source in various types of communication apparatuses or electronic apparatuses. Moreover, a gyro sensor is used in electronic apparatuses that perform car body control in a vehicle, self-position detection of a car navigation system, vibration control correction (so-called camera shake correction) of a digital camera, a camcorder, and a mobile phone, and the like. The vibrating element that perform the flexural vibration is used as an element that detects an angular velocity in the gyro sensor.

As these electronic apparatuses are miniaturized, the vibrating element is also required to be miniaturized. When the vibrating element is miniaturized, the processing accuracy in forming the vibrating element becomes relatively high. For example, in the vibrating element including a vibrating arm, when the shape of the vibrating arm is asymmetrical, an oblique vibration including displacement in an in-plane direction caused by a primary vibration and displacement in an out-of-plane direction intersecting the in-plane direction caused by a leakage vibration is generated. As a method for eliminating the oblique vibration, a manufacturing method of a flexural vibrator element is known, as disclosed in JP-A-2013-9221, in which a metal film (adjustment film) formed in a coupling area between a vibrating arm and a base portion is trimmed by a laser.

However, even with the use of the manufacturing method of the flexural vibrator element disclosed in JP-A-2013-9221, it is difficult to completely eliminate the oblique vibration of the vibrating element, so that there is a problem that the manufacturing cost of the vibrating element is increased due to a reduction in the yield of the vibrating element and the load of a process of individually trimming the vibrating element. Moreover, a CI (Crystal Impedance) value increases in the vibrating element having a large oblique vibration, so that there is a risk of failing to satisfy desired specifications.

SUMMARY

An advantage of some aspects of the invention is to solve at least a part of the problems described above, and the invention can be implemented as the following forms or application examples.

Application Example 1

This application example is directed to a vibrating element including: a vibrating arm that performs a flexural vibration; and a drive electrode provided on the vibrating arm, wherein when a direction in which the vibrating arm extends is a Y-axis, a direction in which the vibrating arm performs a primary vibration is an X-axis, and a direction orthogonal to the Y-axis and the X-axis is a Z-axis, the vibrating arm performs the flexural vibration with a displacement ratio of greater than 0% and 20% or less where the displacement ratio is obtained by dividing a displacement amount in the Z-axis direction by a displacement amount in the X-axis direction.

According to this application example, the vibrating element includes the vibrating arm on which the drive electrode is formed. When an AC voltage is applied to the drive electrode to cause the vibrating arm to perform the flexural vibration, the vibrating arm generates, due to the asymmetry or the like of the shape of the vibrating arm, an oblique vibration including displacement in the X-axis direction (in-plane direction) caused by the primary vibration and displacement in the Z-axis direction (out-of-plane direction) caused by a leakage vibration. In the vibrating element of the application example, the displacement ratio (the displacement amount in the Z-axis direction/the displacement amount in the X-axis direction) of the vibrating arm is allowed to be greater than 0% and 20% or less. It was found, as a result of obtaining the relationship between the displacement ratio and the CI value, that in a vibrating element including a vibrating arm with a displacement ratio of 20% or less, the rate of increase in CI value is suppressed within 10% with respect to a CI value of a vibrating element including a vibrating arm with a displacement ratio of 0, and thus a vibrating element having a CI value of desired specifications is obtained. Since the displacement ratio of the vibrating element is allowed up to 20%, an improvement in the yield of the vibrating element and a reduction in the load required for trimming are achieved, and thus the manufacturing cost of the vibrating element can be reduced. Hence, it is possible to provide the vibrating element having a desired CI value and with reduced cost.

Application Example 2

In the vibrating element according to the application example, it is preferable that the displacement ratio is 2% or more and 13% or less.

According to this application example, the displacement ratio (the displacement amount in the Z-axis direction/the displacement amount in the X-axis direction) of the vibrating arm is allowed to be 2% or more and 13% or less. When the displacement ratio of the vibrating arm is up to 13%, the increase gradient of the CI value of the vibrating element with respect to a change in displacement ratio is gentle, and thus the deviation in the CI value of the vibrating element can be suppressed. Moreover, since the displacement ratio of the vibrating arm is set to be 2% or more, it is unnecessary that the displacement of the vibrating arm in the Z-axis direction should be suppressed more than necessary, the load required for trimming is reduced, and thus the manufacturing cost of the vibrating element can be reduced.

Application Example 3

This application example is directed to a vibrating element including: a vibrating arm that performs a flexural vibration; and a drive electrode provided on the vibrating arm, wherein when a direction in which the vibrating arm extends is a Y-axis, a direction in which the vibrating arm performs a primary vibration is an X-axis, and a direction orthogonal to the Y-axis and the X-axis is a Z-axis, an amount of shift in the X-axis direction between two sides along the X-axis in a cross-section of the vibrating arm formed by the X-axis and the Z-axis is 0.8% or less with respect to a dimension of the vibrating arm in the Z-axis direction.

According to this application example, the vibrating element includes the vibrating arm on which the drive electrode is formed. When an AC voltage is applied to the drive electrode to cause the vibrating arm to perform the flexural vibration, the vibrating arm generates, due to the asymmetry or the like of the shape of the vibrating arm, an oblique vibration including displacement in the X-axis direction (in-plane direction) caused by the primary vibration and displacement in the Z-axis direction (out-of-plane direction) caused by a leakage vibration. For the vibrating element of the application example, in the cross-section of the vibrating arm in the XZ plane, the amount of shift in the X-axis direction between the side located on the +Z-direction side of the Z-axis and the side located on the −Z-direction side of the Z-axis, that is, the amount of shift in the X-axis direction between the two sides facing each other along the X-axis is allowed up to 0.8% with respect to the dimension of the vibrating arm in the Z-axis direction. It was found, as a result of obtaining the relationship between the shift amount and the CI value, that in a vibrating element with a shift amount of 0.8% or less, the rate of increase in CI value is suppressed within 10% with respect to a CI value of a vibrating element with a shift amount of 0, and thus a vibrating element having a CI value of desired specifications is obtained. Since the shift amount of the vibrating element is allowed up to 0.8%, an improvement in the yield of the vibrating element and a reduction in the load required for trimming are achieved, and thus the manufacturing cost of the vibrating element can be reduced. Hence, it is possible to provide the vibrating element having a desired CI value and with reduced cost.

Application Example 4

In the vibrating element according to the application example, it is preferable that the shift amount is 0.5% or less with respect to the dimension of the vibrating arm in the Z-axis direction.

According to this application example, the shift amount is allowed up to 0.5%. When the shift amount is up to 0.5%, the increase gradient of the CI value of the vibrating element with respect to a change in shift amount is gentle, so that the deviation in the CI value of the vibrating element can be suppressed.

Application Example 5 and Application Example 6

In the vibrating element according to the application example, it is preferable that the vibrating element includes a base portion and a pair of the vibrating arms, and the pair of vibrating arms extend from one of edges of the base portion in the Y-axis direction and are disposed side by side in the X-axis direction.

According to this application examples, the vibrating element includes the pair of vibrating arms extending from the one edge of the base portion in the Y-axis direction and disposed side by side in the X-axis direction. The pair of vibrating arms are caused to perform the flexural vibration in opposite directions from each other along the X-axis direction. Due to this, since the vibrations transmitted to the base portion as the vibrating arms perform the flexural vibration are canceled out via the base portion, the Q (Quality factor) value of the vibrating element can be improved.

Application Example 7 and Application Example 8

In the vibrating element according to the application example, it is preferable that the vibrating element includes a pair of detection arms extending from the other edge of the base portion on the side opposite to the one edge.

According to these application examples, the vibrating element is a gyro element having a so-called H-type configuration including the pair of vibrating arms extending from the one edge of the base portion in the Y-axis direction and the pair of detection arms extending from the other edge of the base portion in the Y-axis direction. Since a drive system and a detection system are separated from each other in the H-type configuration, electrostatic coupling between electrodes or between wirings of the drive system and the detection system is reduced and thus detection sensitivity for angular velocity can be stabilized.

Application Example 9 and Application Example 10

In the vibrating element according to the application example, it is preferable that the vibrating element includes a base portion, coupling arms extending on both sides of the base portion along the X-axis direction from the base portion, and detection arms extending on both sides of the base portion along the Y-axis direction from the base portion, and the vibrating arm extends on both sides of each of the coupling arms along the Y-axis direction from a tip portion of each of the coupling arms.

According to these application examples, the vibrating element is a gyro element having a so-called double-T type configuration including the two detection arms extending on both sides of the base portion along the Y-axis direction from the base portion, and the four vibrating arms extending on both sides of the base portion along the Y-axis direction via the two coupling arms extending on both sides of the base portion along the X-axis direction from the base portion. Since the drive system and the detection system are separated from each other in a point-symmetrical manner in the double-T type configuration, electrostatic coupling between electrodes or between wirings of the drive system and the detection system is further reduced and thus detection sensitivity for angular velocity can be further stabilized.

Application Example 11

In the vibrating element according to the application example, it is preferable that a weight portion is provided on a distal end side of the vibrating arm on the side opposite to one edge side of the base portion.

According to this application example, the weight portion is provided on the distal end side of the vibrating arm on the side opposite to the one edge side of the base portion. Therefore, a predetermined drive vibration is obtained while suppressing an increase in the length of the vibrating arm, a broad adjustment range is secured for suppressing the leakage vibration. Therefore, it is possible to provide the vibrating element that is more miniaturized and has highly sensitive characteristics.

Application Example 12 and Application Example 13

In the vibrating element according to the application example, it is preferable that a weight portion is provided on a distal end side of at least one of the vibrating arm and the detection arm on the side opposite to one edge side of the base portion.

According to these application examples, the weight portion is provided on the distal end side of at least one of the vibrating arm and the detection arm on the side opposite to the one edge side of the base portion. Therefore, a predetermined drive vibration or detection vibration is obtained while suppressing an increase in the lengths of the vibrating arm and the detection arm, and also, a broad adjustment range is secured for suppressing the leakage vibration. Therefore, it is possible to provide the vibrating element that is more miniaturized and has highly sensitive characteristics.

Application Example 14 and Application Example 15

These application examples are directed to an electronic device including: the vibrating element according to the application example; an electronic component including a drive circuit that excites at least the vibrating arm; and a package accommodating at least one of the vibrating element and the electronic component.

According to these application examples, since the electronic device includes the vibrating element having desired detection accuracy and with reduced cost, it is possible to provide the electronic device having a predetermined performance and with reduced cost.

Application Example 16 and Application Example 17

These application examples are directed to an electronic apparatus including the vibrating element according to the application example.

According to these application examples, since the electronic apparatus includes the vibrating element satisfying a desired CI specification and with reduced cost, it is possible to provide the electronic apparatus having a predetermined performance and with reduced cost.

Application Example 18 and Application Example 19

These application examples are directed to a moving object including the vibrating element according to the application example.

According to these application examples, since the moving object includes the vibrating element satisfying a desired CI specification and with reduced cost, it is possible to provide the moving object having a predetermined performance and with reduced cost.

BRIEF DESCRIPTION OF THE DRAWINGS

The invention will be described with reference to the accompanying drawings, wherein like numbers reference like elements.

FIGS. 1A and 1B schematically show a tuning fork-type vibrator element as one example of a vibrating element according to Embodiment 1, in which FIG. 1A is a plan view and FIG. 1B is a cross-sectional view taken along the line A-A in FIG. 1A.

FIGS. 3A and 3B show the relationship between the shape of the vibrating arm and a displacement amount, in which FIG. 3A is a table and FIG. 3B is a graph.

FIGS. 5A and 5B schematically show a gyro element as one example of a vibrating element according to Embodiment 2, in which FIG. 5A is a perspective view and FIG. 5B is a plan view.

FIGS. 6A and 6B are diagrams for explaining an electrode configuration of the gyro element, in which FIG. 6A is a cross-sectional view taken along the line C-C in FIG. 5B and FIG. 6B is a cross-sectional view taken along the line D-D in FIG. 5B.

FIG. 10A is a cross-sectional view taken along the line E-E in FIG. 9; and FIG. 10B is a cross-sectional view taken along the line F-F in FIG. 9.

DESCRIPTION OF EXEMPLARY EMBODIMENTS

Figure 1A:
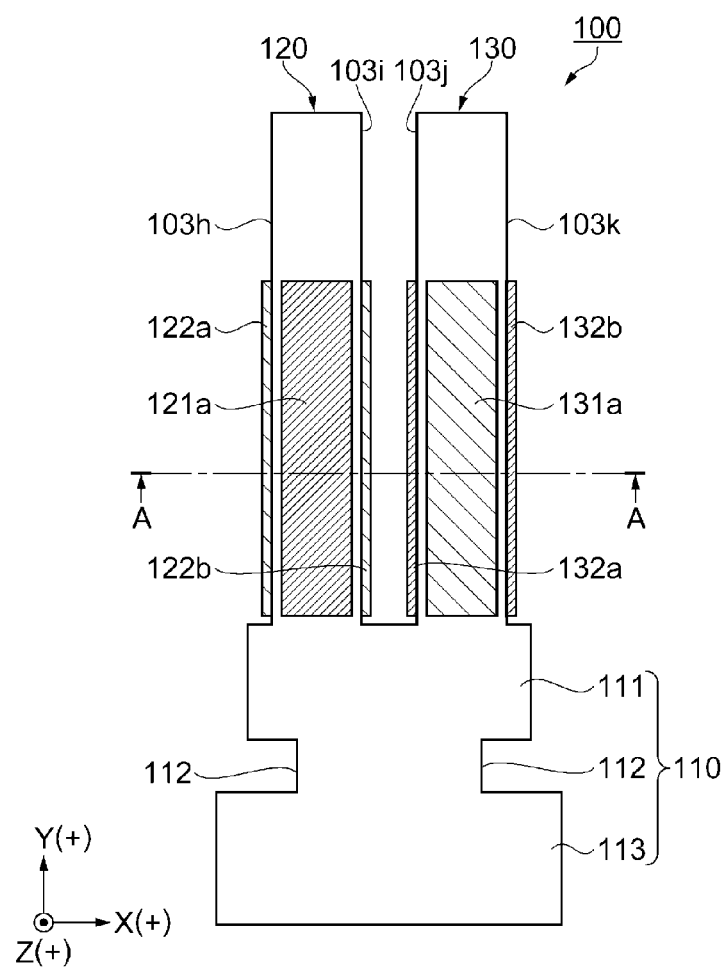

Hereinafter, embodiments of the invention will be described with reference to the drawings. In the drawings below, the scales of layers or members are different from actual ones so that the layers or members have a recognizable size. Moreover, in FIGS. 1A to 2C, 5A to 6B, and 8 to 10B, an X-axis, a Y-axis, and a Z-axis are shown as three axes orthogonal to one another for convenience of description, in which the head side of each arrow shown in the drawings is defined as "+side" and the tail side is defined as "−side". Moreover, in the following description, a direction parallel to the X-axis is referred to as "X-axis direction", a direction parallel to the Y-axis is referred to as "Y-axis direction, and a direction parallel to the Z-axis is referred to as "Z-axis direction".

Embodiment 1

Vibrating Element

Figure 1B:
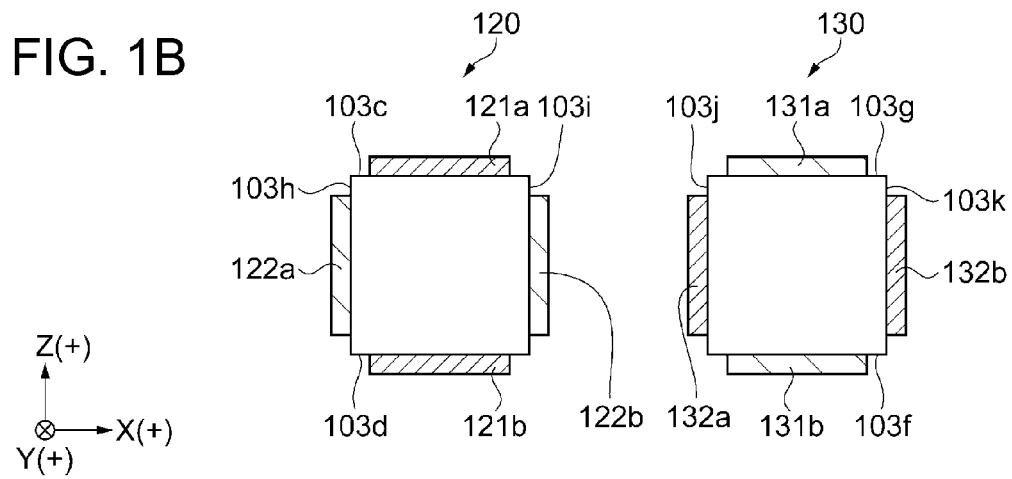

First, a schematic configuration of a vibrating element according to Embodiment 1 will be described with reference to FIGS. 1A and 1B. FIG. 1A is a plan view schematically showing a schematic configuration of a tuning fork-type vibrator element as a vibrating element according to Embodiment 1. FIG. 1B is a cross-sectional view taken along the line A-A in FIG. 1A.

As shown in FIGS. 1A and 1B, the tuning fork-type vibrator element 100 as a vibrating element includes drive vibrating arms 120 and 130 as vibrating arms that perform a flexural vibration, and later-described drive electrodes provided on the drive vibrating arms 120 and 130. The tuning fork-type vibrator element 100 includes a base portion 110. The drive vibrating arms 120 and 130 extend in pairs in the +Y-axis direction from one of edges of the base portion 110 in the Y-axis direction. The base portion 110 has a plate shape including a narrow width portion 111 and a wide width portion 113 disposed with a constricted portion 112 therebetween. The base portion 110 may have a shape not provided with the constricted portion 112, that is, a substantially rectangular plate shape. The drive vibrating arms 120 and 130 as vibrating arms are a pair of prism-shaped vibrating bodies extending substantially parallel to each other in the Y-axis direction from a +Y-side edge of the narrow width portion 111 in the base portion 110. The base portion 110 and the drive vibrating arms 120 and 130, which constitute the tuning fork-type vibrator element 100, are formed integrally, and quartz crystal is used as a base material. The tuning fork-type vibrator element 100 of Embodiment 1 is formed by a photolithographic method and a dry etching method using a fluorine-based gas or the like.

Quartz crystal has an X-axis called an electrical axis, a Y-axis called a mechanical axis, and a Z-axis called an optic axis. The base material forming the tuning fork-type vibrator element 100 is cut along a plane defined by the X-axis and the Y-axis orthogonal to each other in the crystal axes of quartz crystal and then processed in a plate shape, and has a predetermined thickness in the Z-axis direction orthogonal to the plane. For the base material, a plate cut by being rotated about the X-axis within the range of 0 to 2 degrees can be used. The predetermined thickness is appropriately set depending on a vibration frequency, external sizes, workability, and the like.

The drive vibrating arm 120 and the drive vibrating arm 130 as vibrating arms vibrate in opposite directions from each other along the X-axis direction (in-plane direction) in an XY plane defined by the X-axis and the Y-axis. That is, when the drive vibrating arm 120 is displaced toward the +X-axis direction, the drive vibrating arm 130 is displaced toward the −X-axis direction; while when the drive vibrating arm 120 is displaced toward the −X-axis direction, the drive vibrating arm 130 is displaced toward the +X-axis direction. When the tip (+Y-axis side) of each of the drive vibrating arms 120 and 130 on the side opposite to the base portion 110 changes its position (moves), this is referred to as "displacement". Moreover, the amount of the movement is referred to as "displacement amount".

The drive vibrating arm 120 extended from the base portion 110 includes a front surface 103c, a rear surface 103d provided on the side opposite to the front surface 103c, and side surfaces 103h and 103i connecting the front surface 103c with the rear surface 103d. The drive vibrating arm 130 includes a front surface 103g, a rear surface 103f provided on the side opposite to the front surface 103g, and side surfaces 103j and 103k connecting the front surface 103g with the rear surface 103f.

Although not shown in the drawing, substantially rectangular-shaped weight portions that are wider (larger in dimension in the X-axis direction) than the drive vibrating arms 120 and 130 may be provided on the distal end side of the drive vibrating arms 120 and 130 on the side opposite to one edge side of the base portion 110. In the configuration in which the drive vibrating arms 120 and 130 are provided with the weight portions, a predetermined drive vibration can be obtained while suppressing an increase in the length (dimension in the Y-axis direction) of the drive vibrating arms 120 and 130, and therefore, the tuning fork-type vibrator element 100 can be miniaturized.

Next, the drive electrodes of the tuning fork-type vibrator element 100 will be described. For driving the drive vibrating arms 120 and 130, the drive vibrating arms 120 and 130 include, as drive electrodes, first drive electrodes 121a, 121b, 132a, and 132b and second drive electrodes 122a, 122b, 131a, and 131b. The first drive electrodes 121a, 121b, 132a, and 132b and the second drive electrodes 122a, 122b, 131a, and 131b are provided so as to extend from the roots of the drive vibrating arms 120 and 130 toward the tips thereof.

As shown in FIG. 1B, the second drive electrode 122a is provided on the side surface 103h of the drive vibrating arm 120 along the extending direction (Y-axis direction) of the drive vibrating arm 120, and the second drive electrode 122b is provided on the side surface 103i on the side opposite to the side surface 103h along the extending direction of the drive vibrating arm 120. The first drive electrode 121a is provided on the front surface 103c of the drive vibrating arm 120 along the extending direction (Y-axis direction) of the drive vibrating arm 120, and the first drive electrode 121b is provided on the rear surface 103d on the side opposite to the front surface 103c along the extending direction of the drive vibrating arm 120.

Although not shown in the drawing, the first drive electrode 121a and the first drive electrode 121b are electrically connected by way of the tip and the like of the drive vibrating arm 120. Similarly, although not shown in the drawing, the second drive electrode 122a and the second drive electrode 122b are electrically connected by way of the tip and the like of the drive vibrating arm 120. Moreover, the first drive electrodes 121a and 121b and the second drive electrodes 122a and 122b are electrically connected to external connection pads (not shown) via wirings (not shown).

Similarly, the first drive electrode 132a is provided on the side surface 103j of the drive vibrating arm 130 along the extending direction (Y-axis direction) of the drive vibrating arm 130, and the first drive electrode 132b is provided on the side surface 103k on the side opposite to the side surface 103j along the extending direction of the drive vibrating arm 130. The second drive electrode 131a is provided on the front surface 103g of the drive vibrating arm 130 along the extending direction (Y-axis direction) of the drive vibrating arm 130, and the second drive electrode 131b is provided on the rear surface 103f on the side opposite to the front surface 103g along the extending direction of the drive vibrating arm 130.

Although not shown in the drawing, the second drive electrode 131a and the second drive electrode 131b are electrically connected by way of the tip and the like of the drive vibrating arm 130. Similarly, although not shown in the drawing, the first drive electrode 132a and the first drive electrode 132b are electrically connected by way of the tip and the like of the drive vibrating arm 130. Moreover, the second drive electrodes 131a and 131b and the first drive electrodes 132a and 132b are electrically connected to external connection pads (not shown) via wirings (not shown).

In the drive vibrating arm 120, the first drive electrode 121a and the first drive electrode 121b are connected so as to be at the same potential, and the second drive electrode 122a and the second drive electrode 122b are connected so as to be at the same potential. In the drive vibrating arm 130, the second drive electrode 131a and the second drive electrode 131b are connected so as to be at the same potential, and the first drive electrode 132a and the first drive electrode 132b are connected so as to be at the same potential. When AC voltages of different phases are applied to the drive electrodes having the configuration described above, the tuning fork-type vibrator element 100 repeats a flexural motion in which the drive vibrating arm 120 and the drive vibrating arm 130 are displaced in opposite directions from each other along the X-axis direction, and performs the flexural vibration at a predetermined resonance frequency.

The above-described configurations of the first drive electrodes 121a, 121b, 132a, and 132b and the second drive electrodes 122a, 122b, 131a, and 131b are not particularly limited, and it is sufficient that the electrodes have conductivity and enable thin film formation. As a specific configuration, for example, the electrodes can be formed of a metal material such as gold (Au), a gold alloy, platinum (Pt), aluminum (Al), an aluminum alloy, silver (Ag), a silver alloy, chromium (Cr), a chromium alloy, copper (Cu), molybdenum (Mo), niobium (Nb), tungsten (W), iron (Fe), titanium (Ti), cobalt (Co), zinc (Zn), or zirconium (Zr), and a conductive material such as indium tin oxide (ITO).

Figure 2A:
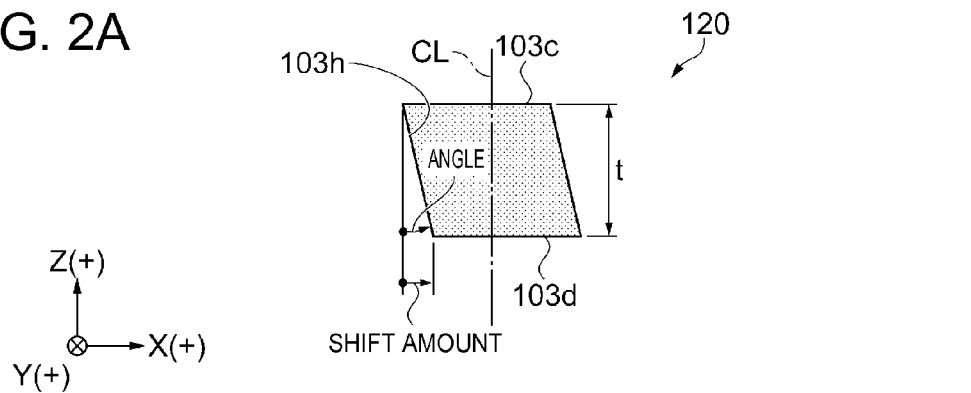
FIG. 2A is a cross-sectional view showing a cross-sectional shape of a vibrating arm.
Figure 2B:
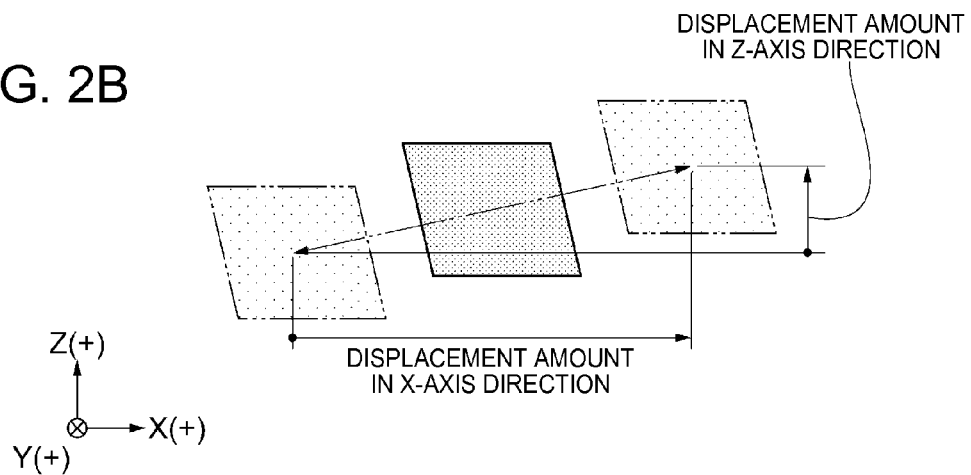
FIGS. 2B and 2C are schematic cross-sectional views showing an oblique vibration of the vibrating arm.
Figure 2C:
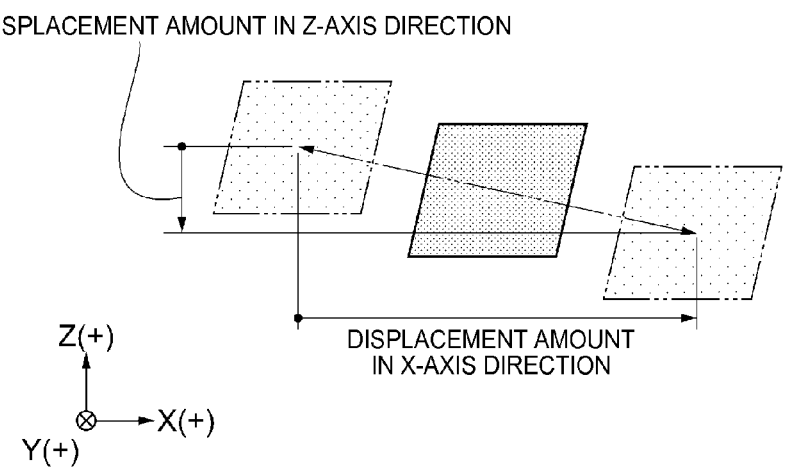

Next, a leakage vibration of the tuning fork-type vibrator element 100 as a vibrating element will be described with reference to FIGS. 2A to 2C. FIG. 2A is a cross-sectional view showing the cross-sectional shape of the vibrating arm. FIGS. 2B and 2C are schematic cross-sectional views showing an oblique vibration of the vibrating arm. In FIGS. 2A to 2C, the drive electrodes are not shown.

As shown in FIG. 2A, when the drive vibrating arm 120 is cut parallel to an XZ plane formed by the X-axis and the Z-axis, the cross-sectional shape may be asymmetrical about a center line CL due to processing variations in the manufacturing process when forming the external form of the tuning fork-type vibrator element 100. Specifically, the cross-section of the drive vibrating arm 120 forms a parallelogram in which a first side formed by the front surface 103c and a second side formed by the rear surface 103d are shifted in opposite directions from each other along the X-axis direction.

When the drive vibrating arm 120 having the shape shown in FIG. 2A is caused to perform the flexural vibration by applying the AC voltages to the first drive electrodes 121a and 121b and the second drive electrodes 122a and 122b (refer to FIGS. 1A and 1B) (during a drive mode), the drive vibrating arm 120 generates an oblique vibration including displacement in the X-axis direction (in-plane direction) caused by a primary vibration and displacement in the Z-axis direction (out-of-plane direction) caused by a leakage vibration. The oblique vibration has two vibration forms. A first vibration form shown in FIG. 2B is a form in which when the drive vibrating arm 120 swings in the +X-axis direction, the leakage vibration is generated in the +Z-axis direction, while when the drive vibrating arm 120 swings in the −X-axis direction, the leakage vibration is generated in the −Z-axis direction. A second vibration form shown in FIG. 2C is a vibration form in which when the drive vibrating arm 120 swings in the +X-axis direction, the leakage vibration is generated in the −Z-axis direction, while when the drive vibrating arm 120 swings in the −X-axis direction, the leakage vibration is generated in the +Z-axis direction. In the tuning fork-type vibrator element 100 having a large oblique vibration, the CI value as a driving impedance is increased and thus remarkably affects starting characteristics, and therefore, the tuning fork-type vibrator element 100 needs to be individually trimmed to suppress the leakage vibration (displacement in the Z-axis direction).

Figures 3A, 3B:
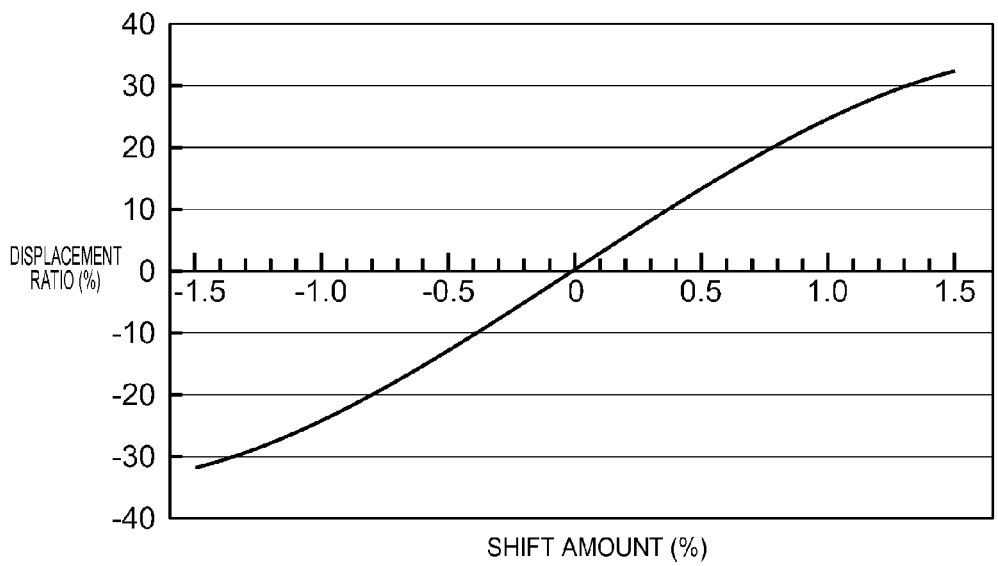

FIG. 3A is a table showing the relationship between the shape of the vibrating arm and the displacement amount. The cross-sectional shape of the drive vibrating arm 120 in the XZ plane can be represented by the amount of shift in the X-axis direction between the first side formed by the front surface 103c and the second side formed by the rear surface 103d shown in FIG. 2A, and the angle formed by the side surface 103h and the Z-axis. The shift amount is shown in percentage (%) based on a thickness t in the Z-axis direction in the drive vibrating arm 120. For the magnitude of oblique vibration, the displacement ratio obtained by dividing the displacement amount of the vibrating arm in the Z-axis direction by the displacement amount in the X-axis direction during the drive mode is expressed in percentage (%). FIG. 3B is a graph showing the relationship between the shift amount and the displacement amount. The horizontal axis represents the shift amount, while the vertical axis represents the displacement ratio (the displacement amount in the Z-axis direction/the displacement amount in the X-axis direction) in percentage (%).

Figure 4:
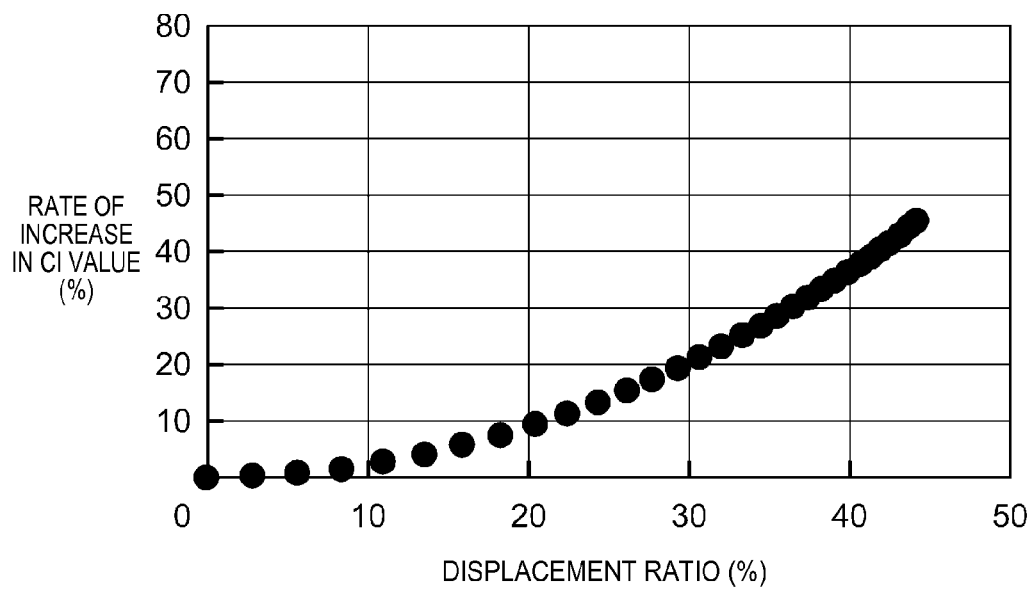
FIG. 4 is a graph showing the relationship between a displacement ratio and a CI value.

FIG. 4 is a graph showing the relationship between the displacement ratio and the CI value. The horizontal axis represents the displacement ratio (the displacement amount in the Z-axis direction/the displacement amount in the X-axis direction) in percentage (%). The vertical axis represents the rate of increase in CI value in percentage (%). As shown in FIG. 4, when the displacement ratio of the drive vibrating arms 120 and 130 of the tuning fork-type vibrator element 100 is 20% or less, the rate of increase in CI value can be suppressed within 10%. Therefore, the displacement ratio of the drive vibrating arms 120 and 130 can be allowed up to 20%. Further, when the displacement ratio is 13% or less, the increase gradient of the CI value with respect to the displacement ratio is gentle, and thus the deviation in CI value can be reduced. Moreover, since the displacement ratio of the drive vibrating arms 120 and 130 is allowed up to 20% or up to 13%, an improvement in the yield of the tuning fork-type vibrator element 100 and a reduction in the load required for trimming are achieved, and thus the manufacturing cost of the vibrating element can be reduced. Further, by setting the displacement ratio of the drive vibrating arms 120 and 130 to be 2% or more, it is unnecessary that the displacement of the drive vibrating arms 120 and 130 in the Z-axis direction should be suppressed more than necessary, the load required for trimming is reduced, and thus the manufacturing cost of the tuning fork-type vibrator element 100 can be further reduced.

It is found from FIGS. 3A to 4 that the setting of the displacement ratio of the drive vibrating arms 120 and 130 to be 20% or less can be realized by setting the amount of shift in the X-axis direction between the front surface 103c and the rear surface 103d as two sides facing each other along the X-axis to be 0.8% or less of the dimension of the drive vibrating arm 120 in the Z-axis direction. Moreover, it is found that the setting of the displacement ratio to be 13% or less can be realized by setting the amount of shift in the X-axis direction between the two sides 103c and 103d facing each other along the X-axis to be 0.5% or less of the dimension of the drive vibrating arm 120 in the Z-axis direction.

The tuning fork-type vibrator element 100 can also be used as a gyro vibrator element (gyro element) in addition to the configuration used as a vibrator element. In this case, one of the pair of drive vibrating arms 120 and 130 is used as a drive vibrating arm, the other drive vibrating arm is used as a detection vibrating arm, and predetermined electrodes are provided on the vibrating arms.

As has been described above, according to the tuning fork-type vibrator element 100 as the vibrating element according to Embodiment 1, the following advantageous effects can be obtained.

In the tuning fork-type vibrator element 100, by setting the displacement ratio of the drive vibrating arms 120 and 130 to be 20% or less, an increase in CI value can be suppressed within 10%. Therefore, the influence of the increase in CI value can be reduced, so that the tuning fork-type vibrator element 100 can have a desired CI value. Further, by setting the displacement ratio to be 13% or less, the deviation in CI value can be reduced. Moreover, since the displacement ratio is allowed up to 20% or up to 13%, an improvement in yield and a reduction in the load required for trimming are achieved, and thus the manufacturing cost of the tuning fork-type vibrator element 100 can be reduced. Further, by setting the displacement ratio to be 2% or more, it is unnecessary that the displacement of the drive vibrating arms 120 and 130 in the Z-axis direction should be suppressed more than necessary, the load required for trimming is reduced, and thus the manufacturing cost of the tuning fork-type vibrator element 100 can be further reduced. Hence, it is possible to provide the tuning fork-type vibrator element 100 as a vibrating element having a desired CI value and with reduced cost.

Embodiment 2

Gyro Element-1

Figure 5A:
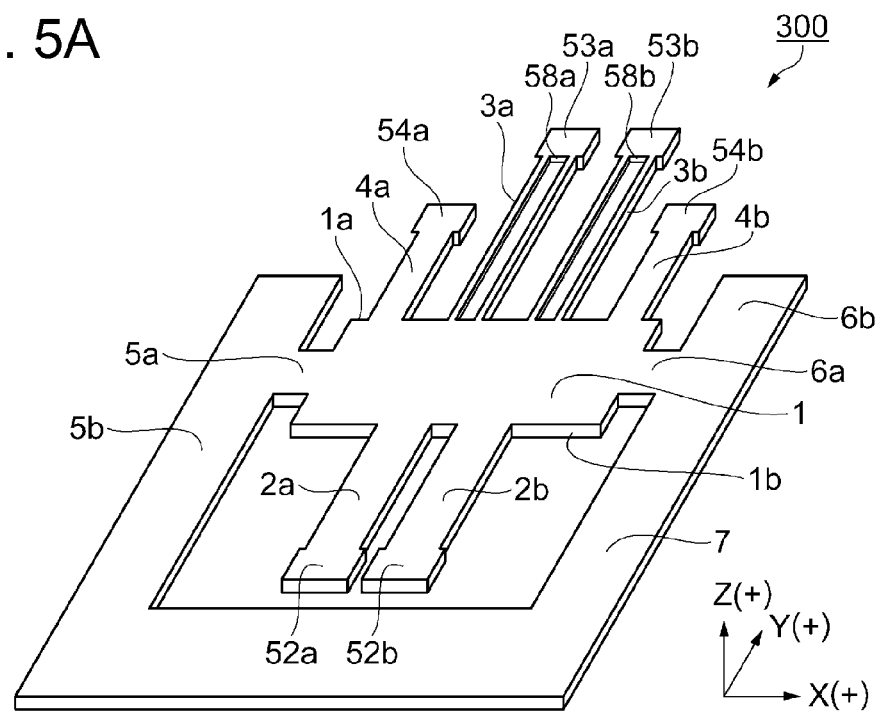
Figure 5B:
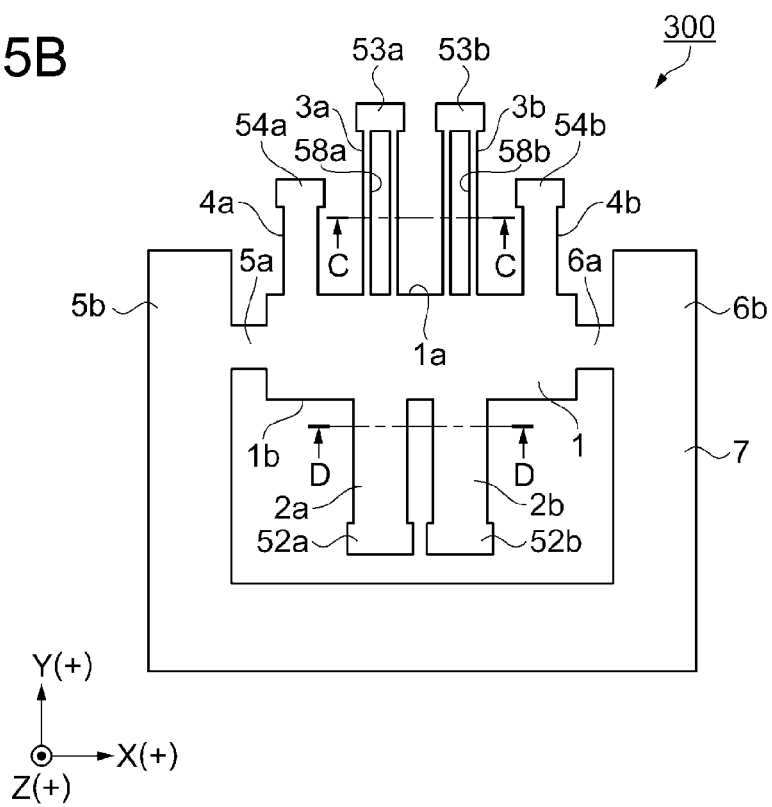
Figure 6A:
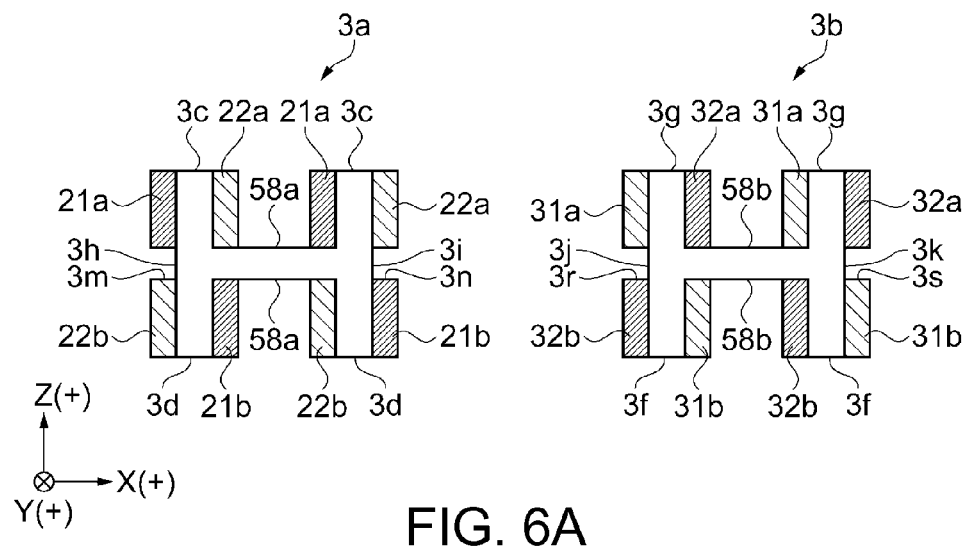
Figure 6B:
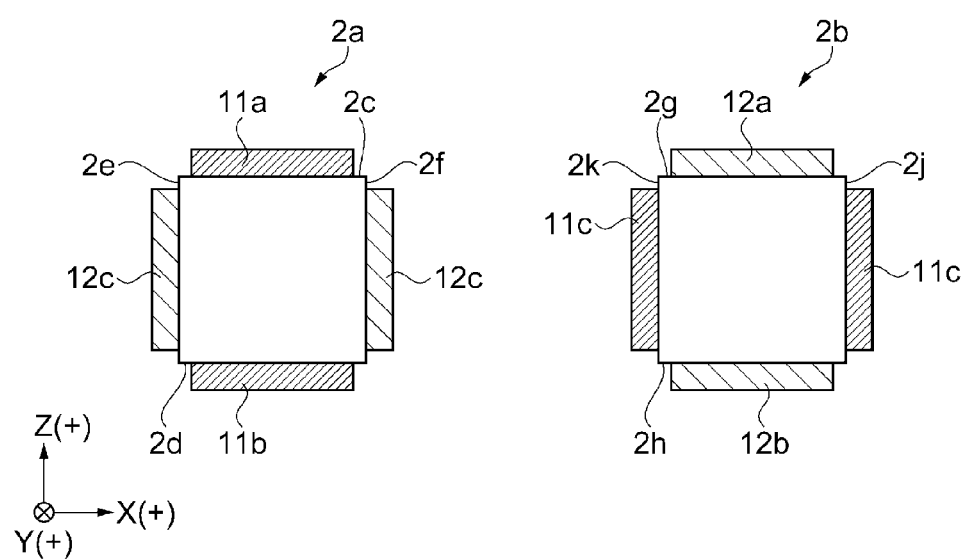

First, a gyro element as a vibrating element according to Embodiment 2 will be described with reference to FIGS. 5A to 6B. FIG. 5A is a perspective view schematically showing the gyro element; and FIG. 5B is a plan view schematically showing the gyro element. FIGS. 6A and 6B are diagrams for explaining an electrode configuration of the gyro element, in which FIG. 6A is a cross-sectional view taken along the line C-C in FIG. 5B and FIG. 6B is a cross-sectional view taken along the line D-D in FIG. 5B.

As shown in FIG. 5A, the gyro element 300 according to Embodiment 2 includes a base portion 1, drive vibrating arms 2a and 2b as vibrating arms, detection vibrating arms 3a and 3b as detection arms, and adjusting vibrating arms 4a and 4b, all of which are integrally formed by processing a base material (material constituting a main portion). Further, the gyro element 300 is provided with a first coupling portion 5a extending from the base portion 1, a first support portion 5b coupled to the first coupling portion 5a, a second coupling portion 6a extending from the base portion 1 in a direction opposite to the first coupling portion 5a, and a second support portion 6b coupled to the second coupling portion 6a. Further, the first support portion 5b and the second support portion 6b are integrally connected on the side of the drive vibrating arms 2a and 2b to thereby constitute a fixed frame portion 7. The gyro element 300 is fixed at predetermined positions of the fixed frame portion 7 to a substrate of a package (not shown) or the like.

In the gyro element 300 of the embodiment, an example of using, as the base material, quartz crystal that is a piezoelectric material will be described. Quartz crystal has an X-axis called an electrical axis, a Y-axis called a mechanical axis, and a Z-axis called an optic axis. In the embodiment, an example of using, as the base material, a so-called quartz crystal Z-plate will be described. The quartz crystal Z-plate is obtained by cutting quartz crystal along a plane defined by the X-axis and the Y-axis orthogonal to each other in the crystal axes of quartz crystal and then processing the cut quartz crystal in a plate shape. The quartz crystal Z-plate has a predetermined thickness in the Z-axis direction orthogonal to the plane. The "predetermined thickness" as used herein is appropriately set depending on the oscillation frequency (resonance frequency), external sizes, workability, and the like. Moreover, for the plate forming the gyro element 300, errors in the angle of cut from quartz crystal are acceptable within some range about each of the X-axis, the Y-axis, and the Z-axis. For example, a plate cut by being rotated about the X-axis within the range of 0 to 2 degrees can be used. The same applies to the Y-axis and the Z-axis.

The gyro element 300 includes the base portion 1 having a substantially rectangular shape and located at the central portion, the pair of drive vibrating arms 2a and 2b extending along the Y-axis so as to be parallel to each other from one edge (edge in the (−)Y-direction in the drawing) 1b of edges 1a and 1b of the base portion 1 in the Y-axis direction, and the pair of detection vibrating arms 3a and 3b extending along the Y-axis so as to be parallel to each other from the other edge (edge in the (+)Y-direction in the drawing) 1a on the side opposite to the one edge 1b of the base portion 1. In this manner, the pair of drive vibrating arms 2a and 2b and the pair of detection vibrating arms 3a and 3b extend in the same axial direction from the respective edges 1a and 1b of the base portion 1. Because of such a shape, the gyro element 300 according to the embodiment is sometimes called an H-type gyro element. In the H-type gyro element 300, since the drive vibrating arms 2a and 2b and the detection vibrating arms 3a and 3b extend from the respective edges 1a and 1b of the base portion 1 in the same axial direction, a drive system and a detection system are separated from each other. Since the drive system and the detection system are separated from each other as described above, the gyro element 300 has a feature that electrostatic coupling between electrodes or between wirings of the drive system and the detection system is reduced and thus detection sensitivity is stabilized. Although Embodiment 2 employs, as an example, the H-type gyro element in which two drive vibrating arms and two detection vibrating arms are provided, the number of each of the vibrating arms may be one or three or more. Moreover, drive electrodes and detection electrodes, which will be described later, may be formed on one vibrating arm.

In the H-type gyro element 300, when an angular velocity W is applied about the Y-axis in a state where the pair of drive vibrating arms 2a and 2b are vibrated in the in-plane direction (+X-axis direction and −X-axis direction), a Coriolis force is generated in the drive vibrating arms 2a and 2b, and the drive vibrating arms 2a and 2b perform a flexural vibration in opposite directions from each other in the out-of-plane direction (+Z-axis direction and −Z-axis direction) intersecting the in-plane direction. Then, the detection vibrating arms 3a and 3b resonate with the flexural vibration of the drive vibrating arms 2a and 2b in the out-of-plane direction, and thus perform a flexural vibration similarly in the out-of-plane direction. At this time, charge is generated, due to a piezoelectric effect, in the detection electrodes provided on the detection vibrating arms 3a and 3b. By detecting the charge, the gyro element 300 can detect the angular velocity W applied to the gyro element 300.

The pair of drive vibrating arms 2a and 2b as vibrating arms extending from the base portion 1 include, as shown in FIGS. 6A and 6B, front surfaces 2c and 2g, rear surfaces 2d and 2h provided on the side opposite to the front surfaces 2c and 2g, and side surfaces 2e, 2f, 2k, and 2j connecting the front surfaces 2c and 2g with the rear surfaces 2d and 2h. Moreover, substantially rectangular-shaped weight portions 52a and 52b that are wider (larger in dimension in the X-axis direction) than the drive vibrating arms 2a and 2b are provided on the distal end side of the drive vibrating arms 2a and 2b on the side opposite to one edge side of the base portion 1 (refer to FIGS. 5A and 5B). In this manner, since the weight portions 52a and 52b are provided in the drive vibrating arms 2a and 2b, a predetermined drive vibration can be obtained while suppressing an increase in the length (dimension in the Y-axis direction) of the drive vibrating arms 2a and 2b, and thus the gyro element can be miniaturized. Although the drive vibrating arms 2a and 2b are provided with electrodes for driving the drive vibrating arms 2a and 2b, the configuration of the electrodes will be described later.

The detection vibrating arms 3a and 3b as a pair of detection arms extending from the base portion 1 include front surfaces 3c and 3g, rear surfaces 3d and 3f provided on the side opposite to the front surfaces 3c and 3g, and side surfaces 3h, 3i, 3j, and 3k connecting the front surfaces 3c and 3g with the rear surfaces 3d and 3f.

Further, substantially rectangular-shaped weight portions 53a and 53b that are wider (larger in dimension in the X-axis direction) than the detection vibrating arms 3a and 3b are provided on the distal end side of the detection vibrating arms 3a and 3b on the side opposite to one edge side of the base portion 1. In this manner, since the weight portions 53a and 53b are provided in the detection vibrating arms 3a and 3b, a predetermined detection vibration can be obtained while suppressing an increase in the length (dimension in the Y-axis direction) of the detection vibrating arms 3a and 3b, and thus the gyro element can be miniaturized. Moreover, the pair of detection vibrating arms 3a and 3b are provided with recesses 58a and 58b. The recesses 58a and 58b in the embodiment are configured to be cut from the both surface sides, the front surfaces 3c and 3g and the rear surfaces 3d and 3f, as shown in FIGS. 6A and 6B, but may be configured to be cut from one surface, that is, from the front surfaces 3c and 3g or the rear surfaces 3d and 3f.

Further, as shown in FIGS. 5A and 5B, the gyro element 300 is provided with the pair of adjusting vibrating arms 4a and 4b extending from the base portion 1 in a direction intersecting the crystal X-axis (electrical axis) of quartz crystal, so as to be parallel to the detection vibrating arms 3a and 3b and interpose the detection vibrating arms 3a and 3b on the inside. That is, the adjusting vibrating arms 4a and 4b extend in the (+)Y-direction along the Y-axis, are located so as to interpose the detection vibrating arms 3a and 3b on the inside with a predetermined gap, and are provided so as to be parallel to the detection vibrating arms 3a and 3b. The adjusting vibrating arms 4a and 4b are sometimes called tuning arms. Since the adjusting vibrating arms 4a and 4b are provided, a leakage output can be adjusted. In other words, charge generated in the detection vibrating arms 3a and 3b due to the leakage (transmission) of a drive vibration, a so-called vibration leakage output, can be canceled out by charge generated in the adjusting vibrating arms 4a and 4b.

Moreover, the adjusting vibrating arms 4a and 4b are formed such that the entire length thereof is shorter than the drive vibrating arms 2a and 2b and the detection vibrating arms 3a and 3b. Due to this, the vibration of the adjusting vibrating arms 4a and 4b for adjusting the leakage output does not hinder the main vibration of the gyro element 300 caused by the drive vibrating arms 2a and 2b and the detection vibrating arms 3a and 3b. Therefore, the vibration characteristics of the gyro element 300 are stabilized, and at the same time, this form is advantageous in terms of miniaturization of the gyro element 300.

Further, substantially rectangular-shaped weight portions 54a and 54b that are wider (longer in length in the X-axis direction) than the adjusting vibrating arms 4a and 4b are provided at the tips of the adjusting vibrating arms 4a and 4b. In this manner, by providing the weight portions 54a and 54b at the tips of the adjusting vibrating arms 4a and 4b, a change in mass can be made remarkable in the adjusting vibrating arms 4a and 4b, and thus it is possible to further improve the effect of contributing to the higher sensitivity of the gyro element 300.

The center of the base portion 1 can be the center of gravity of the gyro element 300. The X-axis, the Y-axis, and the Z-axis are orthogonal to one another, and defined as passing through the center of gravity. The external form of the gyro element 300 can be line-symmetrical about an imaginary center line passing through the center of gravity in the Y-axis direction. Due to this, the external form of the gyro element 300 is well-balanced, so that the characteristics of the gyro element 300 are stabilized and detection sensitivity is improved, which is preferable. The shape of the external form of the gyro element 300 can be formed by etching (wet etching or dry etching) using a photolithographic technique. Multiple pieces of the gyro elements 300 can be obtained from one quartz crystal wafer.

Next, one embodiment of an electrode arrangement of the gyro element 300 will be described with reference to FIGS. 6A and 6B. FIG. 6A shows cross-sections of the detection vibrating arms 3a and 3b at the portion C-C shown in FIG. 5B; and FIG. 6B shows cross-sections of the drive vibrating arms 2a and 2b at the portion D-D shown in FIG. 5B.

First, the detection electrodes formed on the detection vibrating arms 3a and 3b and detecting a strain generated in the quartz crystal as the base material due to the vibration of the detection vibrating arms 3a and 3b will be described. As shown in FIG. 6A, the detection vibrating arms 3a and 3b are provided with the recesses 58a and 58b as described above. The recesses 58a and 58b in the embodiment are provided on both surface sides, the front surfaces 3c and 3g and the rear surfaces 3d and 3f.

The detection vibrating arm 3a is provided with a first detection electrode 21a on the front surface 3c side and a second detection electrode 22b on the rear surface 3d side on the side surface 3h. The first detection electrode 21a and the second detection electrode 22b are divided by an electrode dividing portion 3m that is located at substantially the center of the detection vibrating arm 3a in the thickness direction (Z-axis direction) thereof and provided along the extending direction (Y-axis direction) of the detection vibrating arm 3a. Further, a second detection electrode 22a is provided on the inside surface of the recess 58a facing the first detection electrode 21a, and a first detection electrode 21b is provided on the inside surface of the recess 58a facing the second detection electrode 22b. Moreover, a second detection electrode 22a on the front surface 3c side and a first detection electrode 21b on the rear surface 3d side are provided on the side surface 3i on the side opposite to the side surface 3h. The second detection electrode 22a and the first detection electrode 21b are divided by an electrode dividing portion 3n that is located at substantially the center of the detection vibrating arm 3a in the thickness direction thereof and provided along the extending direction of the detection vibrating arm 3a. Further, a first detection electrode 21a is provided on the inside surface of the recess 58a facing the second detection electrode 22a, and a second detection electrode 22b is provided on the inside surface of the recess 58a facing the first detection electrode 21b.

Although not shown in the drawing, the first detection electrode 21a and the first detection electrode 21b are electrically connected by way of the tip and the like of the detection vibrating arm 3a. Although not shown in the drawing, the second detection electrode 22a and the second detection electrode 22b are electrically connected by way of the tip and the like of the detection vibrating arm 3a. The first detection electrodes 21a and 21b and the second detection electrodes 22a and 22b are extended to the vicinity of the tip of the detection vibrating arm 3a. Moreover, the first detection electrodes 21a and 21b and the second detection electrodes 22a and 22b are electrically connected to external connection pads (not shown) via wirings (not shown). Moreover, the first detection electrodes 21a and 21b and the second detection electrodes 22a and 22b are also electrically connected to adjusting electrodes (not shown) formed on the adjusting vibrating arm 4a (refer to FIGS. 5A and 5B).

Similarly, the detection vibrating arm 3b is provided with a second detection electrode 31a on the front surface 3g side and a first detection electrode 32b on the rear surface 3f side on the side surface 3j. The second detection electrode 31a and the first detection electrode 32b are divided by an electrode dividing portion 3r that is located at substantially the center of the detection vibrating arm 3b in the thickness direction (Z-axis direction) thereof and provided along the extending direction (Y-axis direction) of the detection vibrating arm 3b. Further, a first detection electrode 32a is provided on the inside surface of the recess 58b facing the second detection electrode 31a, and a second detection electrode 31b is provided on the inside surface of the recess 58b facing the first detection electrode 32b. Moreover, a first detection electrode 32a on the front surface 3g side and a second detection electrode 31b on the rear surface 3f side are provided on the side surface 3k on the side opposite to the side surface 3j. The first detection electrode 32a and the second detection electrode 31b are divided by an electrode dividing portion 3s that is located at substantially the center of the detection vibrating arm 3b in the thickness direction thereof and provided along the extending direction of the detection vibrating arm 3b. Further, a second detection electrode 31a is provided on the inside surface of the recess 58b facing the first detection electrode 32a, and a first detection electrode 32b is provided on the inside surface of the recess 58b facing the second detection electrode 31b.

Although not shown in the drawing, the second detection electrode 31a and the second detection electrode 31b are electrically connected by way of the tip and the like of the detection vibrating arm 3b. Although not shown in the drawing, the first detection electrode 32a and the first detection electrode 32b are electrically connected by way of the tip and the like of the detection vibrating arm 3b. The second detection electrodes 31a and 31b and the first detection electrodes 32a and 32b are extended to the vicinity of the tip of the detection vibrating arm 3b. Moreover, the second detection electrodes 31a and 31b and the first detection electrodes 32a and 32b are electrically connected to external connection pads (not shown) via wirings (not shown). Moreover, the second detection electrodes 31a and 31b and the first detection electrodes 32a and 32b are also electrically connected to adjusting electrodes (not shown) formed on the adjusting vibrating arm 4b (refer to FIGS. 5A and 5B).

In the detection vibrating arm 3a, the first detection electrode 21a and the first detection electrode 21b are connected so as to be at the same potential, and the second detection electrode 22a and the second detection electrode 22b are connected so as to be at the same potential. Due to this, a strain generated by the vibration of the detection vibrating arm 3a is detected by detecting a potential difference between the first detection electrodes 21a and 21b and the second detection electrodes 22a and 22b. Similarly, in the detection vibrating arm 3b, the first detection electrode 32a and the first detection electrode 32b are connected so as to be at the same potential, and the second detection electrode 31a and the second detection electrode 31b are connected so as to be at the same potential. Due to this, a strain generated by the vibration of the detection vibrating arm 3b is detected by detecting a potential difference between the first detection electrodes 32a and 32b and the second detection electrodes 31a and 31b.

Next, drive electrodes 11a, 11b, 11c, 12a, 12b, and 12c provided on the drive vibrating arms 2a and 2b for driving the drive vibrating arms 2a and 2b will be described. As shown in FIG. 6B, the drive electrode 11a and the drive electrode 11b are formed up to the weight portion 52a (refer to FIGS. 5A and 5B) on the front surface (one main surface) 2c and the rear surface (the other main surface) 2d, respectively, of the drive vibrating arm 2a. Moreover, the drive electrode 12c is formed up to the weight portion 52a (refer to FIGS. 5A and 5B) of the drive vibrating arm 2a on one side surface 2e and the other side surface 2f of the drive vibrating arm 2a. Similarly, the drive electrode 12a and the drive electrode 12b are formed up to the weight portion 52b (refer to FIGS. 5A and 5B) on the front surface (one main surface) 2g and the rear surface (the other main surface) 2h, respectively, of the drive vibrating arm 2b. Moreover, the drive electrode 11c is formed up to the weight portion 52b (refer to FIGS. 5A and 5B) of the drive vibrating arm 2b on one side surface 2j and the other side surface 2k of the drive vibrating arm 2b.

The drive electrodes 11a, 11b, 11c, 12a, 12b, and 12c formed on the drive vibrating arms 2a and 2b are disposed such that the drive electrodes disposed to face each other via the drive vibrating arms 2a and 2b are at the same potential. Although not shown in the drawing, a so-called tuning-fork vibration is excited in the drive vibrating arms 2a and 2b by alternately providing a potential difference between the drive electrodes 11a, 11b, and 11c and the drive electrodes 12a, 12b, and 12c through a connection pad that is formed on a first fixing portion and to which the drive electrodes 11a, 11b, and 11c are connected and a connection pad that is formed on a second fixing portion and to which the drive electrodes 12a, 12b, and 12c are connected.

Next, electrodes provided on the adjusting vibrating arms 4a and 4b will be described. Although not shown in the drawing, adjusting electrodes at the same potential are formed on the front and rear surfaces of the adjusting vibrating arm 4a. Moreover, other adjusting electrodes at the same potential are formed on both side surfaces of the adjusting vibrating arm 4a. Similarly, adjusting electrodes at the same potential are formed on the front and rear surfaces of the adjusting vibrating arm 4b. Moreover, other adjusting electrodes at the same potential are formed on both side surfaces of the adjusting vibrating arm 4b.

The above-described configurations of the drive electrodes 11a, 11b, 11c, 12a, 12b, and 12c, the first detection electrodes 21a, 21b, 32a, and 32b, the second detection electrodes 22a, 22b, 31a, and 31b, and the adjusting electrodes are similar to the electrode configurations described in Embodiment 1, and therefore, the description thereof is omitted in the embodiment.

Next, a leakage vibration of the gyro element 300 as a vibrating element will be described using the drive vibrating arm 2a.

The cross-sectional shape of the drive vibrating arm 2a cut parallel to the XZ plane is sometimes formed in a parallelogram or the like, similarly to that in FIG. 2A, because of, for example, processing errors generated in a dry etching process. In this state, when a flexural vibration is excited in the drive vibrating arm 2a by applying the AC voltages to the drive electrodes 11a and 11b and the drive electrodes 12c (during the drive mode), the drive vibrating arm 2a generates an oblique vibration including displacement in the X-axis direction (in-plane direction) caused by a primary vibration and displacement in the Z-axis direction (out-of-plane direction) caused by a leakage vibration. The oblique vibration has two vibration forms similarly to those in FIGS. 2B and 2C.

The gyro element 300 detects charge generated in the detection electrodes of the detection vibrating arms 3a and 3b resonating with the flexural vibration (displacement) in the Z-axis direction generated in the drive vibrating arms 2a and 2b by the angular velocity ω about the Y-axis. Hence, the gyro element 300 having a large oblique vibration remarkably affects detection sensitivity for the angular velocity ω, and therefore, the gyro element 300 needs to be individually trimmed to suppress the leakage vibration (displacement in the Z-axis direction).

Figure 7:
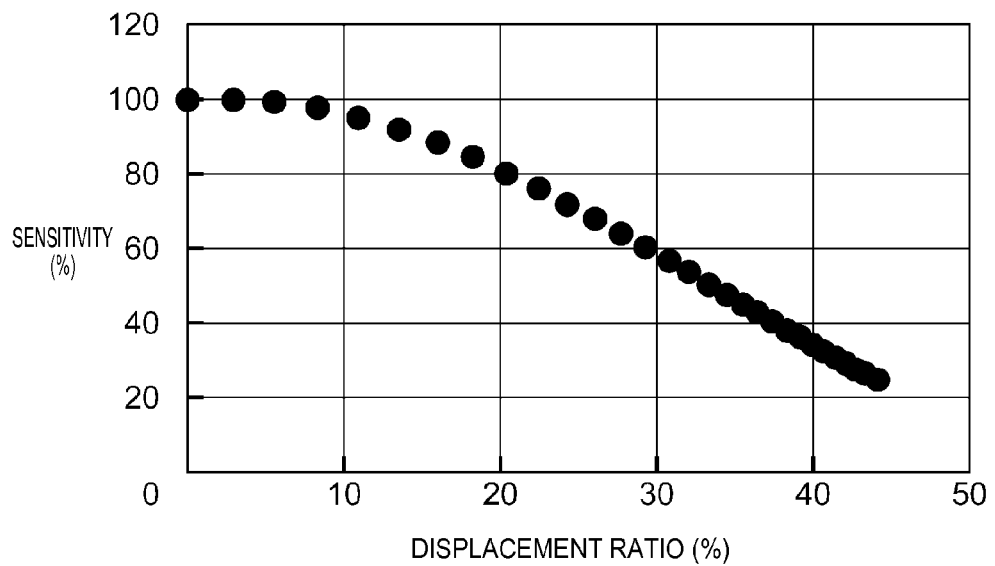
FIG. 7 is a graph showing the relationship between the displacement ratio and the sensitivity for angular velocity.

FIG. 7 is a graph showing the relationship between the displacement ratio and the detection sensitivity for the angular velocity. The horizontal axis in FIG. 7 represents, in percentage (%), the displacement ratio (the displacement amount in the Z-axis direction/the displacement amount in the X-axis direction) obtained by dividing the displacement amount of the drive vibrating arm in the Z-axis direction by the displacement amount in the X-axis direction during the drive mode. The vertical axis represents a reduction in the detection sensitivity for the angular velocity ω in percentage (%). As shown in FIG. 7, when the displacement ratio of the drive vibrating arms 2a and 2b is 20% or less, a reduction in the detection sensitivity for the angular velocity W is suppressed within 20% (80% or more of the detection sensitivity in the absence of the leakage vibration). Further, when the displacement ratio is 13% or less, the reduction gradient of the detection sensitivity with respect to the displacement ratio is gentle, and thus the deviation in the detection sensitivity can be reduced. Due to this, it is found that by setting the displacement ratio of the drive vibrating arms 2a and 2b of the gyro element 300 to be more than 0% and 20% or less, further preferably, to be 2% or more and 13% or less, the reduction in sensitivity can be reduced, desired detection sensitivity can be provided, and it is unnecessary that the displacement of the drive vibrating arms 2a and 2b of the gyro element 300 in the Z-axis direction should be suppressed more than necessary.

In the description of the gyro element 300 according to Embodiment 2, an example has been used, in which the pair of detection vibrating arms 3a and 3b and the pair of adjusting vibrating arms 4a and 4b interposing the detection vibrating arms 3a and 3b therebetween are provided at one edge of the base portion 1, and the pair of drive vibrating arms 2a and 2b are provided at the other edge. However, the invention is not limited to this configuration. For example, the invention may employ a form in which the drive vibrating arms and the adjusting vibrating arms are extended in the same direction from the same edge of the base portion.

As has been described above, according to the gyro element 300 as a vibrating element according to Embodiment 2, the following advantageous effects can be obtained.

By setting the displacement ratio of the drive vibrating arms 2a and 2b of the gyro element 300 to be 13% or less, preferably, to be 10% or less, the reduction in sensitivity can be reduced, and thus the gyro element 300 can have desired detection sensitivity. By setting the displacement ratio of the drive vibrating arms 2a and 2b of the gyro element 300 to be more than 0%, preferably, to be 2% or more, since it is unnecessary that the displacement of the drive vibrating arms 2a and 2b of the gyro element 300 in the Z-axis direction caused by the leakage vibration should be suppressed more than necessary, the load required for trimming can be reduced, and the yield can be improved. Hence, it is possible to provide the gyro element 300 as a vibrating element with reduced cost and having desired detection sensitivity.

Embodiment 3

Gyro Element-2

Next, a gyro element 400 as a vibrating element according to Embodiment 3 will be described with reference to FIG. 8.

Figure 8:
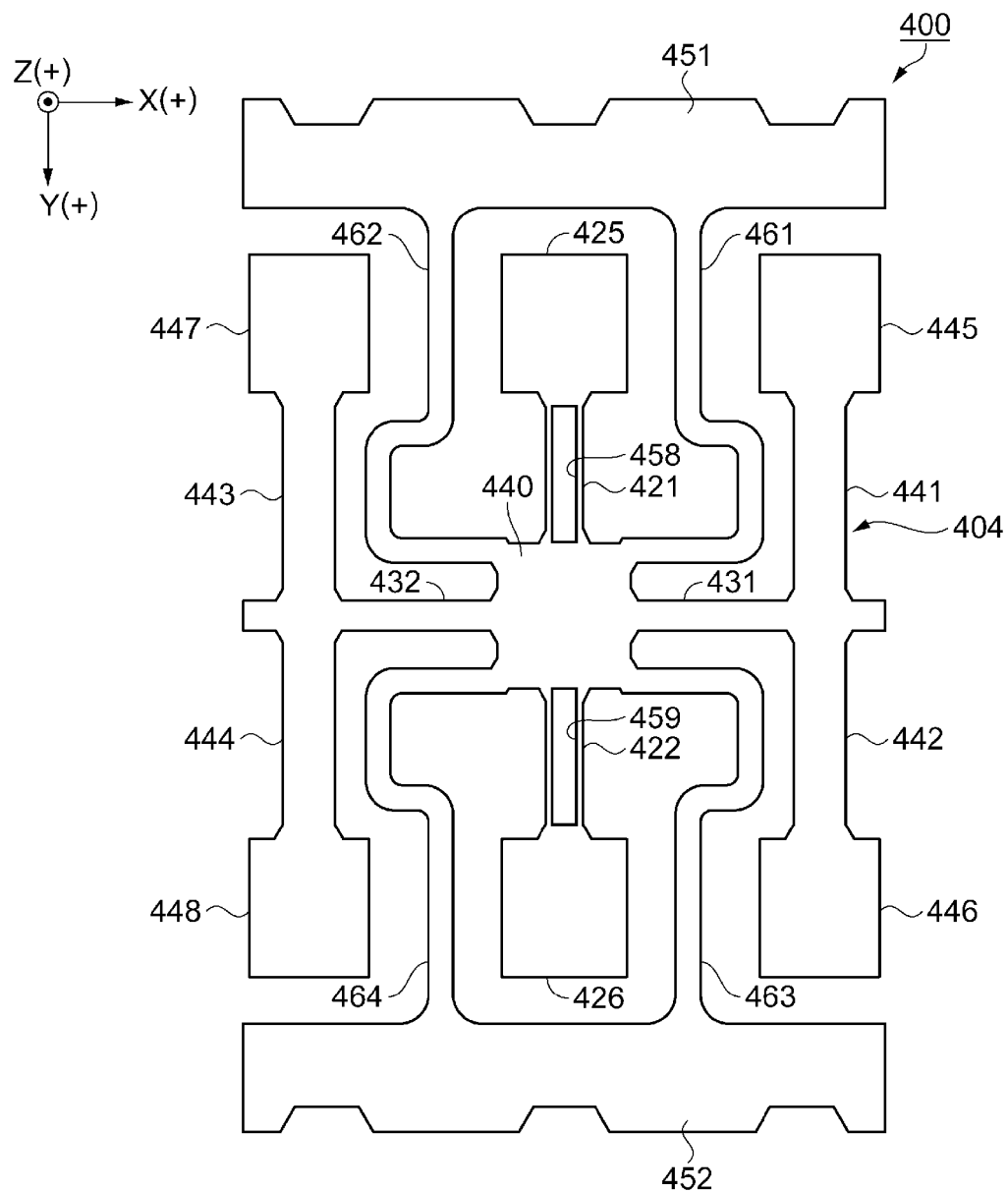
FIG. 8 is a plan view schematically showing a gyro element as one example of a vibrating element according to Embodiment 3.

FIG. 8 schematically shows a schematic configuration of the gyro element according to Embodiment 3, and is a plan view of the gyro element as viewed from the +side of the Z-axis direction. The gyro element 400 is provided with a detection signal electrode, a detection signal wiring, a detection signal terminal, a detection ground electrode, a detection ground wiring, a detection ground terminal, a drive signal electrode, a drive signal wiring, a drive signal terminal, a drive ground electrode, a drive ground wiring, a drive ground terminal, and the like, all of which are omitted in FIG. 8.

The gyro element 400 according to Embodiment 3 is an "out-of-plane axis detection-type" sensor element that detects an angular velocity about the Z-axis. Although not shown in the drawing, the gyro element 400 includes a base material, and pluralities of electrodes, wirings, and terminals provided on the front surface of the base material. The gyro element 400 can be composed of a piezoelectric material such as quartz crystal, lithium tantalate, or lithium niobate, and among these, the gyro element 400 is preferably composed of quartz crystal. Due to this, it is possible to obtain the gyro element 400 capable of providing excellent vibration characteristics (frequency characteristics).

The gyro element 400 includes a vibrating body 404 having a so-called double-T shape, a first support portion 451 and a second support portion 452 as support portions that support the vibrating body 404, and a first beam 461, a second beam 462, a third beam 463, and a fourth beam 464 that couple the vibrating body 404 with the first support portion 451 and the second support portion 452.

The vibrating body 404 extends on the XY plane, and has a thickness in the Z-axis direction. The vibrating body 404 includes a base portion 440 located at the center, a first detection vibrating arm 421 and a second detection vibrating arm 422 extending from the base portion 440 on both sides along the Y-axis direction, a first coupling arm 431 and a second coupling arm 432 extending from the base portion 440 on both sides along the X-axis direction, a first drive vibrating arm 441 and a second drive vibrating arm 442 as vibrating arms extending from the tip portion of the first coupling arm 431 on both sides along the Y-axis direction, and a third drive vibrating arm 443 and a fourth drive vibrating arm 444 as vibrating arms extending from the tip portions of the second coupling arm 432 on both sides along the Y-axis direction. Substantially quadrilateral weight portions (hammerheads) 425, 426, 445, 446, 447, and 448 that are wider than the portions on the base end side are provided on the distal end side of the first and second detection vibrating arms 421 and 422 and the first, second, third, and fourth drive vibrating arms 441, 442, 443, and 444 on the side opposite to one edge side of the base portion 440. By providing the weight portions 425, 426, 445, 446, 447, and 448, the detection sensitivity of the gyro element 400 for angular velocity is improved.

The first detection vibrating arm 421 is provided with bottomed recesses 458, and the second detection vibrating arm 422 is provided with bottomed recesses 459. The recesses 458 and 459 are cut from both surface sides, the front surface and the rear surface. The recess may be configured to be cut from any one of surfaces, that is, the front surface or the rear surface.

Moreover, the first and second support portions 451 and 452 extend along the X-axis direction. Between the first and second support portions 451 and 452, the vibrating body 404 is located. In other words, the first and second support portions 451 and 452 are disposed so as to face each other along the Y-axis direction via the vibrating body 404. The first support portion 451 is coupled with the base portion 440 via the first beam 461 and the second beam 462. The second support portion 452 is coupled with the base portion 440 via the third beam 463 and the fourth beam 464.

The first beam 461 passes between the first detection vibrating arm 421 and the first drive vibrating arm 441 to couple the first support portion 451 with the base portion 440. The second beam 462 passes between the first detection vibrating arm 421 and the third drive vibrating arm 443 to couple the first support portion 451 with the base portion 440. The third beam 463 passes between the second detection vibrating arm 422 and the second drive vibrating arm 442 to couple the second support portion 452 with the base portion 440. The fourth beam 464 passes between the second detection vibrating arm 422 and the fourth drive vibrating arm 444 to couple the second support portion 452 with the base portion 440.

Each of the first beam 461 to the fourth beam 464 is formed in an elongated shape with a serpentine portion that extends along the Y-axis direction while reciprocating along the X-axis direction, and therefore has elasticity in all directions. Therefore, even when an impact is applied from the outside, detection noises caused by this impact can be reduced or suppressed because each of the beams 461, 462, 463, and 464 has a function of absorbing the impact.

The gyro element 400 having the configuration described above detects the angular velocity $\omega$ about the Z-axis as follows. In the drive vibration of the gyro element 400, when an electric field is generated between the drive signal electrode (not shown) and the drive ground electrode (not shown) in a state where no angular velocity $\omega$ is applied, the drive vibrating arms 441, 442, 443, and 444 perform a flexural vibration in the X-axis direction. At this time, the first and second drive vibrating arms 441 and 442 and the third and fourth drive vibrating arms 443 and 444 perform vibrations in a plane-symmetrical manner with respect to the YZ plane passing through the central point (center of gravity). Therefore, the base portion 440, the first and second coupling arms 431 and 432, and the first and second detection vibrating arms 421 and 422 hardly vibrate.

When the angular velocity $\omega$ is applied to the gyro element 400 about the Z-axis in the state of performing the drive vibration, a Coriolis force in the Y-axis direction acts on the drive vibrating arms 441, 442, 443, and 444 and the coupling arms 431 and 432, and in response to the vibration in the Y-axis direction, a detection vibration in the X-axis direction is excited. Then, the strain of the detection vibrating arms 421 and 422 generated by the vibration is detected as a detection signal, so that the angular velocity $\omega$ is obtained.

Similarly to the gyro element 300 of Embodiment 2 described above, it is desirable that, in the gyro element 400, the displacement ratio of the drive vibrating arms 441, 442, 443, and 444 is set to be more than 0% and 20% or less, further preferably, to be 2% or more and 13% or less. Due to this, a reduction in sensitivity can be reduced, and the gyro element 400 can have desired detection sensitivity. Moreover, it is unnecessary that the displacement of the drive vibrating arms 441, 442, 443, and 444 in the Z-axis direction should be suppressed more than necessary.

In the gyro element 400 according to Embodiment 3, a configuration in which the recesses 458 and 459 are provided in the first detection vibrating arm 421 and the second detection vibrating arm 422 has been described. However, the invention is not limited to this configuration, and a configuration in which the recesses 458 and 459 are not provided may be employed.

As has been described above, according to the gyro element 400 as a vibrating element according to Embodiment 3, the following advantageous effects can be obtained.

By setting the displacement ratio of the drive vibrating arms 441, 442, 443, and 444 of the gyro element 400 to be 13% or less, preferably, to be 10% or less, the reduction in sensitivity can be reduced, and thus the gyro element 400 can have desired detection sensitivity. By setting the displacement ratio of the drive vibrating arms 441, 442, 443, and 444 of the gyro element 400 to be more than 0%, preferably, to be 2% or more, since it is unnecessary that the displacement of the drive vibrating arms 441, 442, 443, and 444 of the gyro element 400 in the Z-axis direction caused by the leakage vibration should be suppressed more than necessary, the load required for trimming can be reduced, and the yield can be improved. Hence, it is possible to provide the gyro element 400 as a vibrating element with reduced cost and having desired detection sensitivity.

Embodiment 4

Gyro Element-3

Figure 9:
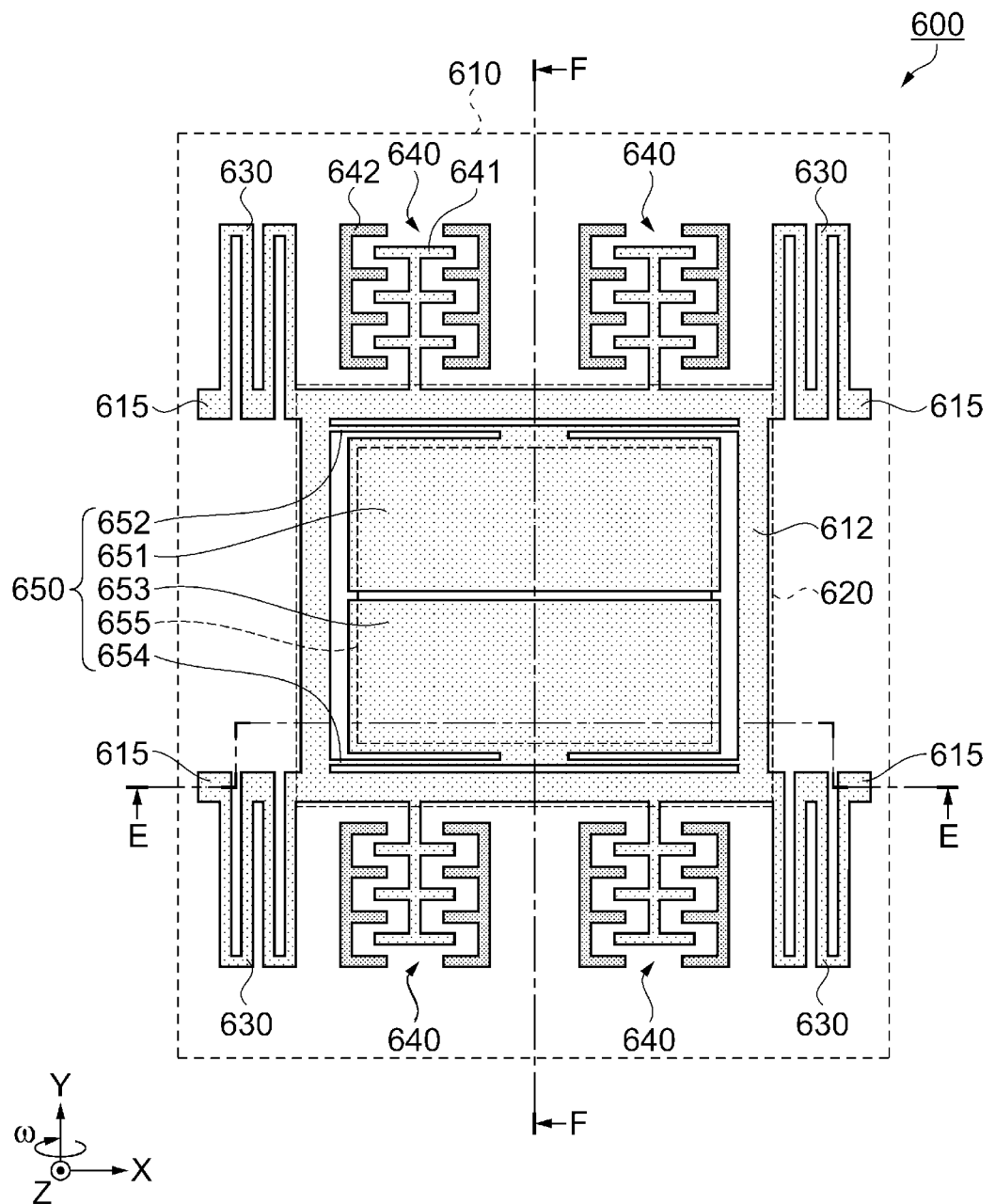
FIG. 9 is a plan view schematically showing a gyro element as one example of a vibrating element according to Embodiment 4.

Next, a gyro element 600 will be described with reference to FIG. 9. FIG. 9 is a plan view schematically showing the gyro element 600 as one example of a vibrating element according to Embodiment 4. FIGS. 10A and 10B schematically show the gyro element 600 according to Embodiment 4, in which FIG. 10A is a cross-sectional view taken along the line E-E in FIG. 9 and FIG. 10B is a cross-sectional view taken along the line F-F in FIG. 9.

As shown in FIGS. 9 to 10B, the gyro element 600 includes a base body 610, a vibrating body 620, elastic support bodies 630, and drive portions 640. In the gyro element 600, the vibrating body 620 is provided via a gap relative to a recess 614 provided in the base body 610. The vibrating body 620 is supported via the elastic support bodies 630 to a fixing portion 617 provided on a first surface 611 (on the base body 610) of the base body 610.

The gyro element 600 is a gyro element (electrostatic capacitive MEMS gyro element) that detects an angular velocity about the Y-axis in a detection portion 650 of the vibrating body 620.

In FIG. 9, the base body 610 is shown in a see-through manner for convenience sake. Viewing from the normal direction of the first surface 611 (refer to FIGS. 10A and 10B) as a base surface of the base body 610 on which the vibrating body 620 is provided, that is, viewing from above the vibrating body 620 supported to the base body 610 is hereinafter referred to as "plan view".

As shown in FIGS. 10A and 10B, the base body 610 includes the first surface 611 and a second surface 611b on the side opposite to the first surface 611. The recess 614 is provided in the first surface 611. The vibrating body 620 (the detection portion 650 and a support portion 612), the elastic support bodies 630, and the drive portions 640 (driving movable electrode portions 641 and driving fixed electrode portions 642) as vibrating arms are provided above the recess 614 via the gap. Due to the recess 614, the vibrating body 620, the elastic support bodies 630, and a portion (the driving movable electrode portions 641) of the drive portion 640 can move in a desired direction without being obstructed by the base body 610. As the material of the base body 610, for example, glass or silicon can be used.

Although the planar shape (shape as viewed from the Z-axis direction) of the recess 614 of the embodiment is a rectangle, the planar shape is not particularly limited. The recess 614 is formed by, for example, a photolithographic technique and an etching technique.

The base body 610 includes the fixing portion 617 appropriately provided on the first surface 611 according to the form of the vibrating body 620 as shown in FIGS. 10A and 10B. One end 615 of each of the elastic support bodies 630 supporting the vibrating body 620 is fixed (bonded) to the fixing portion 617, so that the fixing portion 617 is a portion that supports the vibrating body 620 via the elastic support bodies 630.

As shown in FIGS. 9 to 10B, the one ends 615 (the fixing portion 617) of the elastic support bodies 630 may be disposed so as to interpose the vibrating body 620 therebetween in the X-axis direction. Moreover, the one ends 615 of the elastic support bodies 630 may be disposed so as to interpose the vibrating body 620 therebetween in the Y-axis direction. That is, the one end 615 of the elastic support body 630 may be provided at two or four places.

A fixing (bonding) method of the first surface 611 (the base body 610) of the fixing portion 617 to the elastic support bodies 630, the driving fixed electrode portions 642, and the like is not particularly limited. When, however, the material of the base body 610 is glass and the material of the vibrating body 620 and the like is silicon for example, anodic bonding can be applied.

The vibrating body 620 is supported via the elastic support bodies 630 to the first surface 611 (on the base body 610) of the base body 610. The vibrating body 620 includes the detection portion 650 and the support portion 612 connected with the detection portion 650. The material of the vibrating body 620 is, for example, silicon doped with an impurity such as phosphorus or boron to provide conductivity. The vibrating body 620 is formed by, for example, processing a silicon substrate (not shown) by a photolithographic technique and an etching technique.

The vibrating body 620 is supported by the one ends 615 of the elastic support bodies 630 to the fixing portion 617 via the elastic support bodies 630, and is disposed spaced from the base body 610. More specifically, the vibrating body 620 is provided via the gap above the recess 614 formed in the base body 610. The vibrating body 620 includes the support portion 612 having a frame-like shape surrounding the detection portion 650 described later. The vibrating body 620 may have a shape symmetrical about a not-shown center line (straight line along the X-axis or the Y-axis).

The elastic support body 630 is configured so as to be able to displace the vibrating body 620 in the X-axis direction. More specifically, the elastic support body 630 extends from the one end 615 of the elastic support body 630 to the vibrating body 620 in a direction along the X-axis, and has a shape extending in the X-axis direction while reciprocating in the Y-axis direction. The one end 615 of the elastic support body 630 is bonded (fixed) to the fixing portion 617 (the first surface 611 of the base body 610). Moreover, the other end of the elastic support body 630 is connected to the support portion 612 of the vibrating body 620. In the embodiment, four elastic support bodies 630 are provided so as to interpose the vibrating body 620 in the X-axis direction.

The material of the elastic support body 630 is, for example, silicon doped with an impurity such as phosphorus or boron to provide conductivity. The elastic support body 630 is formed integrally with the vibrating body 620 by, for example, processing a silicon substrate (not shown) by a photolithographic technique and an etching technique.

The detection portion 650 is provided on the inside of the support portion 612 of the vibrating body 620 (the central side of the vibrating body 620) in the plan view. In other words, the detection portion 650 is provided on the side opposite to the arrangement side of the drive portion 640, described later, with respect to the support portion 612.

The detection portion 650 includes a first flap plate 651 and a second flap plate 653 as movable electrodes, a first beam portion 652 connected with the first flap plate 651, a second beam portion 654 connected with the second flap plate 653, and a detecting fixed electrode 655. For the first flap plate 651 and the second flap plate 653, silicon is doped with an impurity such as phosphorus or boron to provide conductivity as described above.

The first flap plate 651 is connected with the first beam portion 652 at a connection portion of the first beam portion 652 located at the central portion thereof in the X-axis direction. The first beam portion 652 is provided along one extending portion of the support portion 612 along the X-axis, and both ends of the first beam portion 652 are connected to two extending portions of the support portion 612 extending along the Y-axis and facing each other. An edge of the first flap plate 651 on the side opposite to an edge thereof connected with the first beam portion 652 is a free edge. The first flap plate 651 can swing in the Z-axis direction with the first beam portion 652 as the axis of rotation.

The second flap plate 653 is connected with the second beam portion 654 at a connection portion of the second beam portion 654 located at the central portion thereof in the X-axis direction. The second beam portion 654 is provided along the other extending portion of the support portion 612 located on the side (the −Y-axis direction) opposite to the one extending portion of the support portion 612 located on the first beam portion 652 side (the +Y-axis direction), with the detection portion 650 interposed between the extending portions.

Both ends of the second beam portion 654 are connected to the inside of two extending portions of the support portion 612 facing each other along the Y-axis direction. An edge of the second flap plate 653 on the side opposite to an edge thereof connected with the second beam portion 654 is a free edge. The second flap plate 653 can swing in the Z-axis direction with the second beam portion 654 as the axis of rotation. The respective free edges of the first flap plate 651 and the second flap plate 653 are disposed so as to be directed inward in the Y-axis direction, and are provided so as to face each other with a gap.

The detecting fixed electrode 655 faces the first flap plate 651 and the second flap plate 653 with a gap, and is provided so as to substantially overlap areas where the first flap plate 651 and the second flap plate 653 are disposed in the plan view. The detecting fixed electrode 655 is provided on a bottom surface 613 of the recess 614 provided in the first surface 611 of the base body 610.

The detecting fixed electrode 655 provided on the bottom surface 613 of the recess 614 of the base body 610 is formed by depositing a transparent electrode material such as ITO (indium tin oxide) or ZnO (zinc oxide) by a sputtering method or the like, and patterning the deposited material by a photolithography method, an etching method, or the like. The detecting fixed electrode 655 is not limited to the transparent electrode material, and a metal material such as gold (Au), a gold alloy, platinum (Pt), aluminum (Al), an aluminum alloy, silver (Ag), a silver alloy, chromium (Cr), a chromium alloy, copper (Cu), molybdenum (Mo), niobium (Nb), tungsten (W), iron (Fe), titanium (Ti), cobalt (Co), zinc (Zn), or zirconium (Zr) can be used. Moreover, when the base body 610 is a semiconductor material such as silicon, an insulating layer is preferably included between the base body 610 and the driving fixed electrode portion 642. As the insulating layer, for example, $SiO_2$ (silicon oxide), AlN (aluminum nitride), SiN (silicon nitride), or the like can be used.

The drive portion 640 has a mechanism capable of exciting the vibrating body 620. The configuration and number of the drive portions 640 are not particularly limited as long as the drive portion 640 can excite the vibrating body 620. For example, the drive portion 640 may be directly provided to the vibrating body 620. As shown in FIG. 9, the drive portion 640 includes the driving movable electrode portion 641 connected to the vibrating body 620 (the support portion 612) on the outside thereof in the Y-axis direction, and the driving fixed electrode portions 642 disposed on the base body 610 to face the driving movable electrode portion 641 with a predetermined distance. The drive portion 640 may not be directly connected to the vibrating body 620, but may have a mechanism to excite the vibrating body 620 with an electrostatic force or the like and be disposed outside the vibrating body 620.

A plurality of driving movable electrode portions 641 may be provided to be connected to the vibrating body 620. In the illustrated example, the driving movable electrode portion 641 is provided to be a comb-tooth-shaped electrode having a trunk portion extending in the +Y-axis direction (or the −Y-axis direction) from the vibrating body 620 and a plurality of branch portions extending in the +X-axis direction and the −X-axis direction from the trunk portion.

The driving fixed electrode portion 642 is disposed outside the driving movable electrode portion 641. The driving fixed electrode portion 642 is bonded (fixed) to the first surface 611 of the base body 610. In the illustrated example, a plurality of driving fixed electrode portions 642 are provided and disposed to face each other via the driving movable electrode portion 641. When the driving movable electrode portion 641 has a comb-tooth shape, the driving fixed electrode portion 642 may have the shape of a comb-tooth-shaped electrode corresponding to the driving movable electrode portion 641.

The material of the drive portion 640 is, for example, silicon doped with an impurity such as phosphorus or boron to provide conductivity. The drive portion 640 is formed integrally with the vibrating body 620 by, for example, processing a silicon substrate (not shown) by a photolithographic technique and an etching technique.

The gyro element 600 having the configuration described above detects the angular velocity ω about the Y-axis as follows.

In the drive vibration of the gyro element 600, the vibrating body 620 performs a reciprocating vibration (motion) along the X-axis, in the state where no angular velocity ω is applied, with an electrostatic force generated between the driving fixed electrode portion 642 and the driving movable electrode portion 641 in the drive portion 640 connected to the support portion 612. More specifically, an alternating voltage is applied between the driving fixed electrode portion 642 and the driving movable electrode portion 641. Due to this, the vibrating body 620 including the first flap plate 651 and the second flap plate 653 can be caused to vibrate along the X-axis at a predetermined frequency.

When the gyro element 600 is subjected to the angular velocity ω about the Y-axis in the state where the gyro element 600 performs the drive vibration, a Coriolis force in the Z-axis direction is generated, and thus the vibrating body 620 (the first flap plate 651 and the second flap plate 653) vibrates in the Z-axis direction. By detecting a change in capacitance caused by the vibration in the Z-axis direction, the angular velocity can be calculated. Specifically, when the first flap plate 651 and the second flap plate 653 vibrate (swing) in the Z-axis direction in a state where a DC voltage is applied to the first flap plate 651 and the second flap plate 653, a distance between the detecting fixed electrode 655, and the first flap plate 651 and the second flap plate 653 is changed, so that an electrostatic capacitance between the detecting fixed electrode 655, and the first flap plate 651 and the second flap plate 653 is changed. By detecting the change in the capacitance as a change in the current of the detecting fixed electrode 655, the angular velocity ω can be obtained.

Next, a leakage vibration of the gyro element 600 as a vibrating element will be described.

A silicon structure of the gyro element 600, which includes the vibrating body 620, has a cross-sectional shape that has to be originally a square or rectangle, but the cross-sectional shape is sometimes formed in a parallelogram or the like, similarly to that in FIG. 2A, because of, for example, processing errors generated in a dry etching process. In this state, when a drive vibration is excited by applying an AC voltage to the drive portion 640, the drive portion 640 generates an oblique vibration including displacement in the X-axis direction (in-plane direction) caused by a primary vibration and displacement in the Z-axis direction (out-of-plane direction) caused by a leakage vibration. When this oblique vibration transmits to the detection portion 650 and the detection portion 650 vibrates in the Z-axis direction as a vibration direction in which an angular velocity is detected, the detection portion 650 detects an angular velocity even though no angular velocity is generated, or an error is generated in an angular velocity detected.

Similarly to the gyro element 300 of Embodiment 2 described above, it is desirable that, in the gyro element 600, the displacement ratio (the displacement amount in the Z-axis direction/the displacement amount in the X-axis direction) of the driving movable electrode portion 641 of the drive portion 640 as a vibrating arm is set be more than 0% and 20% or less, further preferably, to be 2% or more and 13% or less. Due to this, a reduction in sensitivity can be reduced, and the gyro element 600 can have desired detection sensitivity.

Gyro Sensor as Electronic Device

Figure 11:
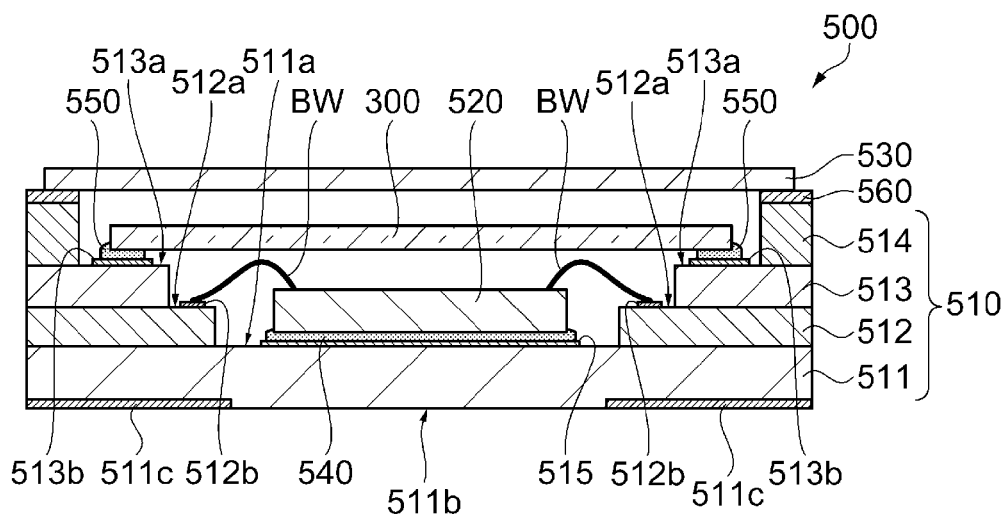
FIG. 11 is a front cross-sectional view showing a schematic configuration of a gyro sensor as one example of an electronic device according to the invention.

Next, a gyro sensor as an electronic device including the gyro element 300 according to Embodiment 2 will be described with reference to FIG. 11. FIG. 11 is a front cross-sectional view showing a schematic configuration of the gyro sensor as one example of the electronic device.

As shown in FIG. 11, the gyro sensor 500 accommodates the gyro element 300 and a semiconductor device 520 as an electronic component in a recess of a package 510. An opening of the package 510 is hermetically sealed by a lid 530 to keep the interior of the gyro sensor 500 airtight. The package 510 is formed by stacking and fixing a plate-like first substrate 511, and frame-like second substrate 512, third substrate 513, and fourth substrate 514 in this order on the first substrate 511, so that the recess in which the semiconductor device 520 and the gyro element 300 are accommodated is formed. The substrates 511, 512, 513, and 514 are formed of, for example, ceramics or the like.

The first substrate 511 is provided with a die pad 515 on an electronic component mounting surface 511a on the recess side on which the semiconductor device 520 is mounted. On the die pad 515, the semiconductor device 520 is placed and fixed. The semiconductor device 520 is bonded and fixed on the die pad 515 with, for example, a brazing material (die attach material) 540.

The semiconductor device 520 includes a drive circuit as an excitation unit that causes the gyro element 300 to perform a drive vibration, and a detection circuit as a detection unit that detects a detection vibration generated in the gyro element 300 when an angular velocity is applied. Specifically, the drive circuit included in the semiconductor device 520 supplies drive signals to the drive electrodes 11a, 11b, and 12c and the drive electrodes 11c, 12a, and 12b (refer to FIGS. 6A and 6B) formed on the pair of drive vibrating arms 2a and 2b (refer to FIGS. 5A and 5B), respectively, of the gyro element 300. Moreover, the detection circuit included in the semiconductor device 520 amplifies detection signals generated in the first detection electrodes 21a and 21b and the second detection electrodes 22a and 22b, and the second detection electrodes 31a and 31b and the first detection electrodes 32a and 32b (refer to FIGS. 6A and 6B) formed on the pair of detection vibrating arms 3a and 3b, respectively, of the gyro element 300, to generate amplified signals. Based on the amplified signals, the detection circuit detects a rotational angular velocity applied to the gyro sensor 500.

The second substrate 512 is formed in a frame-like shape having an opening sized to be able to accommodate the semiconductor device 520 to be mounted on the die pad 515. The third substrate 513 is formed in a frame-like shape having an opening wider than the opening of the second substrate 512, and is stacked and fixed on the second substrate 512. A second substrate surface 512a appears inside the opening of the third substrate 513 after the third substrate 513 is stacked on the second substrate 512, and a plurality of IC connection terminals 512b to which bonding wires BW that are electrically connected with electrode pads (not shown) of the semiconductor device 520 are connected are formed on the second substrate surface 512a. The electrode pads (not shown) of the semiconductor device 520 and the IC connection terminals 512b provided in the package 510 are electrically connected using a wire bonding method. That is, the plurality of electrode pads provided on the semiconductor device 520 and the corresponding IC connection terminals 512b of the package 510 are connected by means of the bonding wires BW. Moreover, any of the IC connection terminals 512b is electrically connected, by means of an internal wiring (not shown) of the package 510, to a plurality of external connection terminals 511c provided on an external bottom surface 511b of the first substrate 511.

The fourth substrate 514 having an opening wider than the opening of the third substrate 513 is stacked and fixed on the third substrate 513. A third substrate surface 513a appears inside the opening of the fourth substrate 514 after the fourth substrate 514 is stacked on the third substrate 513, and a plurality of gyro element connection terminals 513b connected with connection pads (not shown) formed on the gyro element 300 are formed on the third substrate surface 513a. The gyro element connection terminals 513b are electrically connected with any of the IC connection terminals 512b by means of an internal wiring (not shown) of the package 510. The gyro element 300 is placed on the third substrate surface 513a with the first support portion 5b and the second support portion 6b (refer to FIGS. 5A and 5B) of the gyro element 300 being aligned with the connection pads and the gyro element connection terminals 513b, and is bonded and fixed to the third substrate surface 513a with a conductive adhesive 550.

Further, the lid 530 is disposed on the upper surface of the opening of the fourth substrate 514 to seal the opening of the package 510, the interior of the package 510 is airtightly sealed, and thus the gyro sensor 500 is obtained. The lid 530 can be formed by using, for example, metal such as Alloy 42 (iron-nickel alloy containing 42% nickel) or Kovar (iron-nickel-cobalt alloy), ceramics, or glass. For example, when the lid 530 is formed of metal, the lid 530 is bonded to the package 510 by seam welding via a seal ring 560 that is formed by die-cutting Kovar alloy or the like to a rectangular ring-shape. A recessed space formed by the package 510 and the lid 530 serves as a space for the gyro element 300 to operate, and therefore, the space is preferably sealed hermetically to produce a reduced-pressure space or an inert gas atmosphere.

Since the gyro sensor 500 as an electronic device includes the gyro element 300 with reduced cost and having desired detection sensitivity, it is possible to provide the gyro sensor 500 having predetermined detection sensitivity at low cost. Moreover, the gyro sensor 500 of the package type having the configuration described above is advantageous in terms of miniaturization and thinning, and can have increased impact resistance.

In addition to the gyro sensor 500, examples of electronic devices to which the vibrating element according to the invention can be applied include, for example, a vibrator as a timing device accommodating the vibrating element in a package, and an oscillator as a timing device accommodating, in a package, the vibrating element and a circuit element including at least a function of vibrating the vibrating element.

Electronic Apparatus

Figure 12A:
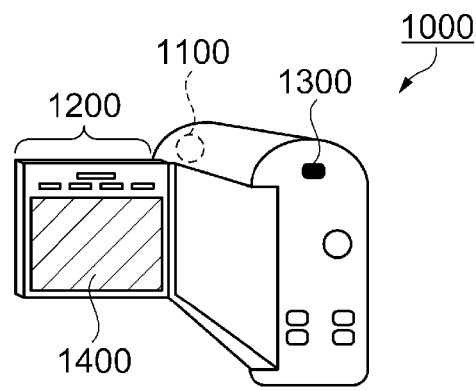
FIGS. 12A to 12C are perspective views each showing one example of electronic apparatuses including the vibrating element.
Figure 12B:
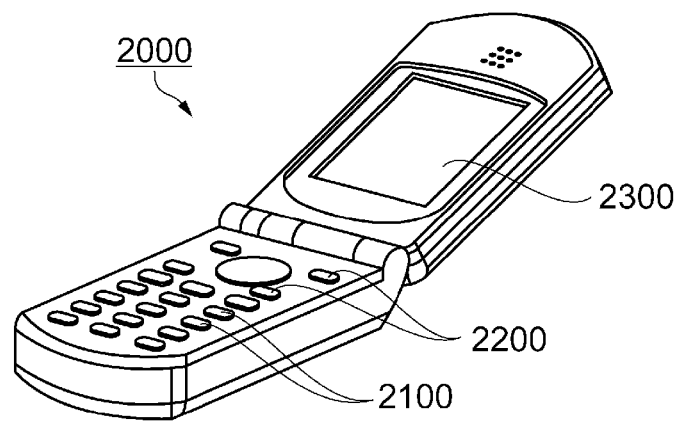
Figure 12C:
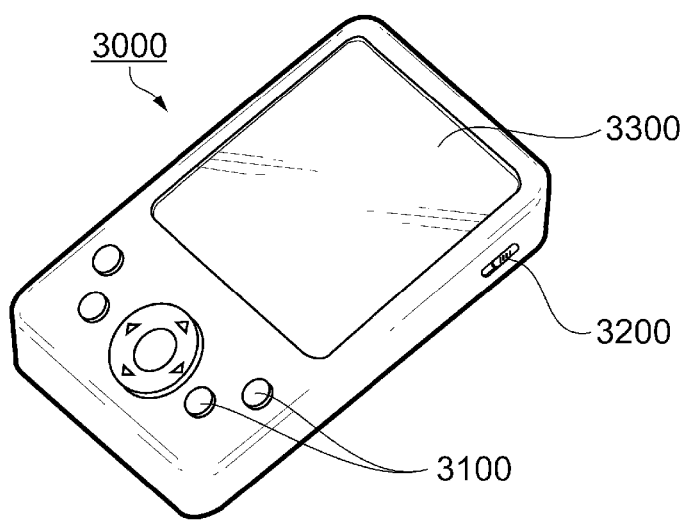

Next, electronic apparatuses including the vibrating element according to the embodiment described above will be described with reference to FIGS. 12A to 12C. In the following description, an example of using the gyro element 300 as one example of the vibrating element will be described. FIGS. 12A to 12C are perspective views each showing one example of the electronic apparatuses including the gyro element 300.

FIG. 12A shows an example in which the gyro element 300 is applied to a digital camcorder 1000 as an electronic apparatus. The digital camcorder 1000 includes an image receiving section 1100, an operating section 1200, a sound input section 1300, and a display unit 1400. The digital camcorder 1000 can have a camera shake correction function by mounting the gyro element 300 of the embodiment described above.

FIG. 12B shows an example in which the gyro element 300 is applied to a mobile phone 2000 as an electronic apparatus. The mobile phone 2000 shown in FIG. 12B includes pluralities of operation buttons 2100 and scroll buttons 2200, and a display unit 2300. By operating the scroll buttons 2200, a screen displayed on the display unit 2300 is scrolled.

FIG. 12C shows an example in which the gyro element 300 is applied to a personal digital assistants (PDA) 3000 as an electronic apparatus. The PDA 3000 shown in FIG. 12C includes a plurality of operation buttons 3100, a power switch 3200, and a display unit 3300. When the power switch 3200 is operated, various kinds of information such as an address book or a schedule note are displayed on the display unit 3300.

By mounting the gyro element 300 of the embodiment described above on the mobile phone 2000 or the PDA 3000, the mobile phone 2000 or the PDA 3000 can be provided with a variety of functions. For example, when the mobile phone 2000 in FIG. 12B is provided with a camera function (not shown), a camera shake correction can be performed similarly to the digital camcorder 1000. Moreover, when the mobile phone 2000 in FIG. 12B or the PDA 3000 in FIG. 12C is provided with a global positioning system that is widely known as GPS, the position or posture of the mobile phone 2000 or the PDA 3000 can be recognized using the GPS by mounting the gyro element 300 of the embodiment described above.

The vibrating elements, one example of which is the gyro element 300, according to the embodiments of the invention can be applied to, in addition to the digital camcorder 1000 in FIG. 12A, the mobile phone in FIG. 12B, and the PDA in FIG. 12C, electronic apparatuses such as an inkjet ejection apparatus (e.g., an inkjet printer), a laptop personal computer, a television set, a camcorder, a video recorder, a car navigation system, a pager, an electronic notebook (including one with communication function), an electronic dictionary, a calculator, an electronic gaming machine, a word processor, a workstation, a videophone, a surveillance TV monitor, electronic binoculars, a POS terminal, a medical apparatus (e.g. an electronic thermometer, a sphygmomanometer, a blood glucose meter, an electrocardiogram measuring system, an ultrasonic diagnosis apparatus, and an electronic endoscope), a fishfinder, various types of measuring instrument, indicators (e.g., indicators used in a vehicle, aircraft, and a ship), and a flight simulator.

Moving Object

Figure 13:
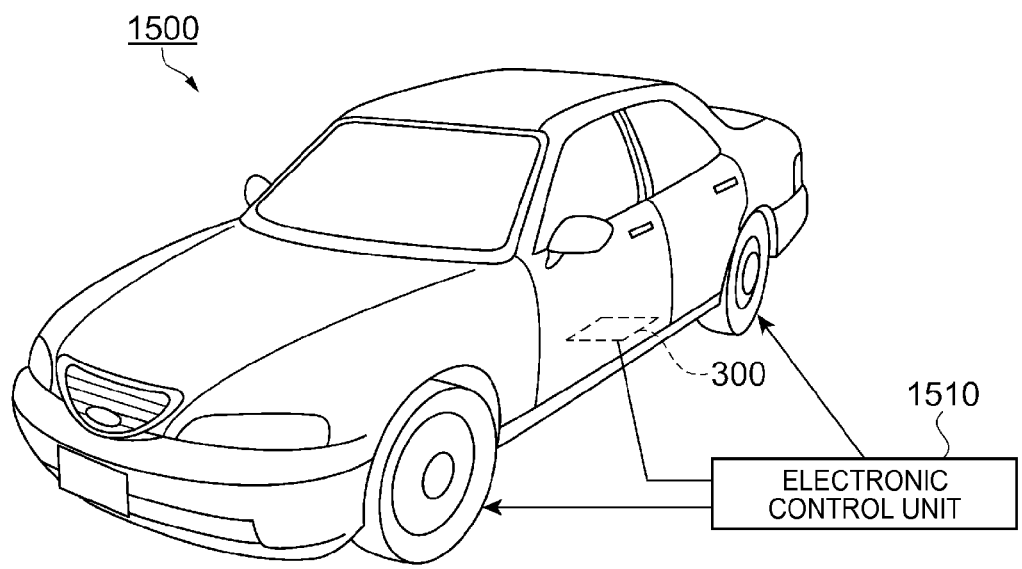
FIG. 13 is a perspective view showing an automobile as a moving object including the vibrating element.

Next, a moving object including the vibrating element according to the embodiment described above will be described. In the following description, an example of using the gyro element 300 as one example of the vibrating element will be described. FIG. 13 is a perspective view schematically showing an automobile as one example of the moving object. In the automobile 1500, the gyro element 300 according to Embodiment 2 is mounted. For example, as shown in the drawing, an electronic control unit (ECU) 1510 into which the gyro element 300 is built to control tires or the like is mounted in a car body of the automobile 1500 as the moving object. In addition, the gyro element 300 can be widely applied to ECUs such as for a keyless entry system, an immobilizer, a car navigation system, a car air-conditioner, an anti-lock brake system (ABS), an air bag, a tire pressure monitoring system (TPMS), engine control, a battery monitor for hybrid and electronic automobiles, and a car body attitude control system.

Although the embodiments have been specifically described, the invention is not limited to the embodiments described above but can be variously modified within the range not departing from the spirit of the invention. For example, an example of using quartz crystal as the forming material of the vibrating element or the gyro element as the vibrating element has been described in the embodiments, however a piezoelectric material other than quartz crystal can be used. For example, aluminum nitride (AlN), an oxide substrate such as lithium niobate ($LiNbO_3$), lithium tantalate ($LiTaO_3$), lead zirconate titanate (PZT), lithium tetraborate ($Li_2B_4O_7$), or langasite crystal ($La_3Ga_5SiO_{14}$), a stacked piezoelectric substrate formed by stacking a piezoelectric material such as aluminum nitride or tantalum pentoxide ($Ta_2O_5$) on a glass substrate, or piezoelectric ceramics can be used. Moreover, the vibrating element can be formed using a material other than the piezoelectric material. For example, the vibrating element can be formed using a silicon semiconductor material or the like. Moreover, the vibration (drive) system of the vibrating element is not limited to the piezoelectric drive system. The configuration and advantageous effects of the invention can be provided in a vibrating element of an electrostatic actuator type using an electrostatic force, or a Lorentz drive type using a magnetic force, in addition to the vibrating element of the piezoelectric drive type using the piezoelectric substrate.

The entire disclosure of Japanese Patent Application No. 2014-220041, filed Oct. 29, 2014 is expressly incorporated by reference herein.

What is claimed is:

1. A vibrating element comprising:
a vibrating arm that performs a flexural vibration; and
a drive electrode provided on the vibrating arm, wherein
when a direction in which the vibrating arm extends is a Y-axis, a direction in which the vibrating arm performs a primary vibration is an X-axis, and a direction orthogonal to the Y-axis and the X-axis is a Z-axis, the vibrating arm performs the flexural vibration with a displacement ratio within a range of 0% to 20% where the displacement ratio is obtained by dividing a displacement amount in the Z-axis direction by a displacement amount in the X-axis direction, and an amount of shift in the X-axis direction between two sides along the X-axis in a cross-section of the vibrating arm formed by the X-axis and the Z-axis is 0.8% or less with respect to a dimension of the vibrating arm in the Z-axis direction.

2. The vibrating element according to claim 1, wherein the displacement ratio is 13% or less, and the shift amount is 0.5% or less with respect to the dimension of the vibrating arm in the Z-axis direction.

3. The vibrating element according to claim 1, further comprising a base portion and a pair of the vibrating arms, wherein
the pair of vibrating arms extend from one of edges of the base portion in the Y-axis direction and are disposed side by side in the X-axis direction.

4. The vibrating element according to claim 3, further comprising a pair of detection arms extending from the other edge of the base portion on the side opposite to the one edge.

5. The vibrating element according to claim 4, wherein
a weight portion is provided on a distal end side of at least one of the vibrating arm and the detection arm on the side opposite to one edge side of the base portion.

6. The vibrating element according to claim 3, wherein
a weight portion is provided on a distal end side of the vibrating arm on the side opposite to one edge side of the base portion.

7. The vibrating element according to claim 1, further comprising:
a base portion;
coupling arms extending on both sides of the base portion along the X-axis direction from the base portion; and
detection arms extending on both sides of the base portion along the Y-axis direction from the base portion, wherein
the vibrating arm extends on both sides of each of the coupling arms along the Y-axis direction from a tip portion of each of the coupling arms.

8. The vibrating element according to claim 7, wherein
a weight portion is provided on a distal end side of at least one of the vibrating arm and the detection arm on the side opposite to one edge side of the base portion.

9. An electronic device comprising:
the vibrating element according to claim 1;
an electronic component including a drive circuit that excites at least the vibrating arm; and
a package accommodating at least one of the vibrating element and the electronic component.

10. An electronic apparatus comprising the vibrating element according to claim 1.

11. A moving object comprising the vibrating element according to claim 1.

12. The vibrating element according to claim 1, wherein the displacement ratio is 2% or more.

* * * * *